US006924464B2

(12) United States Patent
Zhou et al.

(10) Patent No.: US 6,924,464 B2
(45) Date of Patent: Aug. 2, 2005

(54) CERAMIC HEATER AND MANUFACTURING METHOD OF CERAMIC HEATER

(75) Inventors: Yanling Zhou, Gifu (JP); Yasutaka Ito, Gifu (JP); Satoru Kariya, Gifu (JP)

(73) Assignee: Ibiden Co., Ltd., Ogaki (JP)

( * ) Notice: Subject to any disclaimer, the term of this patent is extended or adjusted under 35 U.S.C. 154(b) by 0 days.

(21) Appl. No.: 10/343,833

(22) PCT Filed: Nov. 26, 2001

(86) PCT No.: PCT/JP01/10285

§ 371 (c)(1), (2), (4) Date: Sep. 22, 2003

(87) PCT Pub. No.: WO02/43441

PCT Pub. Date: May 30, 2002

(65) Prior Publication Data

US 2004/0060925 A1 Apr. 1, 2004

(30) Foreign Application Priority Data

Nov. 24, 2000 (JP) ....................................... 2000-357581

(51) Int. Cl.[7] ............................ H05B 3/68; C23C 16/00

(52) U.S. Cl. ..................... 219/444.1; 219/548; 118/724

(58) Field of Search ........................... 219/443.1, 444.1, 219/462.1, 465.1, 466.1, 543, 544, 547, 548; 118/724, 725

(56) References Cited

U.S. PATENT DOCUMENTS 4,002,883 A * 1/1977 Hurko ........................ 219/543
4,536,645 A * 8/1985 Mio et al. ................... 219/543
5,118,983 A * 6/1992 Morita et al. ............... 313/340
5,294,778 A * 3/1994 Carman et al. ............. 219/385
5,643,483 A * 7/1997 Kubota et al. .............. 219/543
5,665,260 A * 9/1997 Kawada et al. .......... 219/467.1
6,465,763 B1 10/2002 Ito et al.
6,475,606 B2 11/2002 Niwa
6,507,006 B1 1/2003 Hiramatsu et al.
2002/0043527 A1 4/2002 Ito
2003/0015521 A1 1/2003 Ito

FOREIGN PATENT DOCUMENTS

JP 2-45602 3/1990
JP 6-202511 7/1994
JP 7-263530 10/1995
JP 10-178253 6/1998
JP 11-40330 2/1999
JP 2000-311767 11/2000
JP 2001-244059 9/2001
JP 2001-297858 10/2001

OTHER PUBLICATIONS

U.S. Appl. No. 10/876,665, filed Jun. 28, 2004, Ito et al.

U.S. Appl. No. 10/901,109, filed Jul. 29, 2004, Hiramatsu et al.

U.S. Appl. No. 10/900,113, filed Jul. 28, 2004, Hiramatsu et al.

(Continued)

*Primary Examiner*—Sang Y. Paik
(74) *Attorney, Agent, or Firm*—Oblon, Spivak, McClelland, Maier & Neustadt, P.C.

(57) ABSTRACT

A ceramic heater manufacturing method capable of preventing reflection of a laser beam at the time the performing trimming by irradiation using a laser beam and performing trimming of a resistance heating element or a conductor layer. The ceramic heater manufacturing method includes forming a resistance heating element having a pattern on a surface of a ceramic substrate; and irradiating a laser beam onto the resistance heating element to form a gutter or a cut after a preceding step to adjust a resistance value of the resistance element. When the resistance heating element is formed on the surface of the ceramic substrate, the resistance heating element is adjusted to have a surface roughness Ra of 0.01 μm or more in accordance with MS B 0601.

21 Claims, 12 Drawing Sheets

OTHER PUBLICATIONS

U.S. Appl. No. 10/759,083, filed Jan. 20, 2004, Hiramatsu et al.
U.S. Appl. No. 10/344,148, filed Feb. 10, 2003, Kariya et al.
U.S. Appl. No. 10/343,833, filed Sep. 22, 2003, Zhou et al.
U.S. Appl. No. 10/386,615, filed Mar. 13, 2003, Hiramatsu et al.
U.S. Appl. No. 10/387,452, filed Mar. 14, 2003, Ito et al.
U.S. Appl. No. 10/363,310, filed Mar. 3, 2003, Ito.
U.S. Appl. No. 10/397,321, filed Mar. 27, 2003, Hiramatsu et al.
U.S. Appl. No. 10/398,393, filed Apr. 7, 2003, Hiramatsu et al.
U.S. Appl. No. 10/442,967, filed May 22, 2003, Hiramatsu et al.
U.S. Appl. No. 10/260,360, filed Oct. 1, 2002, Niwa.
U.S. Appl. No. 10/615,950, filed Jul. 10, 2003, Hiramatsu et al.
U.S. Appl. No. 10/416,497, filed May 19, 2003, Hiramatsu et al.
U.S. Appl. No. 10/618,651, filed Sep. 15, 2003, Ito et al.
U.S. Appl. No. 10/618,623, filed Jul. 15, 2003, Ito et al.
U.S. Appl. No. 10/618,655, filed Jul. 15, 2003, Ito et al.
U.S. Appl. No. 10/618,665, filed Jul. 15, 2003, Ito et al.
U.S. Appl. No. 10/432,639, filed Jun. 10, 2003, Ito et al.
U.S. Appl. No. 10/619,567, filed Jul. 16, 2003, Hiramatsu et al.
U.S. Appl. No. 10/362,941, filed Apr. 28, 2003, Ito.
U.S. Appl. No. 10/670,354, filed Sep. 26, 2003, Niwa.
U.S. Appl. No. 10/658,454, filed Sep. 10, 2003, Ito et al.
U.S. Appl. No. 10/663,681, filed Sep. 17, 2003, Ito et al.
U.S. Appl. No. 10/473,585, filed Oct. 9, 2003, Ito.
U.S. Appl. No. 10/697,287, filed Oct. 31, 2003, Ito et al.
U.S. Appl. No. 10/718,535, filed Nov. 24, 2003, Hiramatsu et al.
U.S. Appl. No. 10/624,589, filed Jul. 23, 2003, Furukawa et al.
U.S. Appl. No. 10/732,296, filed Dec. 11, 2003, Ito et al.
U.S. Appl. No. 10/755,308, filed Jan. 13, 2004, Hiramatsu et al.
U.S. Appl. No. 10/766,027, filed Jan. 29, 2004, Ito et al.
U.S. Appl. No. 10/746,081, filed Dec. 29, 2003, Hiramatsu et al.
U.S. Appl. No. 09/915,418, filed Jul. 27, 2001, Inventor: Ito.
U.S. Appl. No. 10/217,029, filed Aug. 13, 2002, Inventor: Ito.
U.S. Appl. No. 09/471,759, filed Dec. 23, 1999, Saito et al.
U.S. Appl. No. 09/462,067, filed Jan. 5, 2001, Furukawa et al.
U.S. Appl. No. 10/345,356, filed Jan. 16, 2003, Ito.
U.S. Appl. No. 09/787,954, filed Mar. 23, 2001, Ito.
U.S. Appl. No. 09/787,816, filed Mar. 23, 2001, Ito.
U.S. Appl. No. 09/787,818, filed Mar. 23, 2001, Ito.
U.S. Appl. No. 09/806,957, filed Apr. 6, 2001, Ito et al.
U.S. Appl. No. 09/926,730, filed Apr. 16, 2001, Hiramatsu et al.
U.S. Appl. No. 09/880,742, filed Jun. 13, 2001, Saito et al.
U.S. Appl. No. 09/880,359, filed Jun. 13, 2001, Saito et al.
U.S. Appl. No. 09/880,379, filed Jun. 13, 2001, Saito et al.
U.S. Appl. No. 09/915,418, filed Jul. 27, 2001, Ito.
U.S. Appl. No. 09/916,682, filed Jul. 30, 2001, Ito.
U.S. Appl. No. 09/890,358, filed Jul. 30, 2001, Ito.
U.S. Appl. No. 09/917,749, filed Jul. 31, 2001, Ito.
U.S. Appl. No. 09/958,689, filed Oct. 10, 2001, Furukawa et al.
U.S. Appl. No. 09/979,676, filed Nov. 05, 2001, Zhou.
U.S. Appl. No. 10/048,894, filed Feb. 1, 2002, Furukawa.
U.S. Appl. No. 10/049,539, filed Nov. 7, 2001, Zhou.
U.S. Appl. No. 10/182,009, filed Jul. 24, 2002, Zhou.
U.S. Appl. No. 10/222,928, filed Aug. 19, 2002, Ito.
U.S. Appl. No. 10/265,413, filed Oct. 7, 2002, Ohashi et al.
U.S. Appl. No. 10/356,519, filed Feb. 3, 2003, Ito.
U.S. Appl. No. 10/217,029, filed Aug. 13, 2002, Ito.
U.S. Appl. No. 09/673,953, filed Dec. 21, 2000, Ito et al.
U.S. Appl. No. 09/524,010, filed Mar. 13, 2000, Niwa.
U.S. Appl. No. 09/946,463, filed Sep. 6, 2001, Niwa.
U.S. Appl. No. 10/244,008, filed Sep. 16, 2002, Niwa.
U.S. Appl. No. 09/806,477, filed Jun. 25, 2001, Ito et al.
U.S. Appl. No. 09/831,887, filed May 23, 2001, Ito et al.
U.S. Appl. No. 09/807,960, filed May 18, 2001, Hiramatsu et al.
U.S. Appl. No. 09/926,012, filed Oct. 24, 2001, Hiramatsu et al.
U.S. Appl. No. 09/926,092, filed Dec. 27, 2001, Ito et al.
U.S. Appl. No. 09/926,297, filed Dec. 26, 2001, Hiramatsu et al.
U.S. Appl. No. 09/926,296, filed Dec. 27, 2001, Ito et al.
U.S. Appl. No. 09/926,362, filed Jan. 16, 2002, Hiramatsu et al.
U.S. Appl. No. 09/926,465, filed Feb. 12, 2002, Furukawa et al.
U.S. Appl. No. 09/926,464, filed Jan. 10, 2002, Hiramatsu et al.
U.S. Appl. No. 09/926,499, filed Mar. 26, 2002, Hiramatsu et al.
U.S. Appl. No. 09/926,714, filed Dec. 6, 2001, Ito et al.
U.S. Appl. No. 09/926,713, filed Mar. 5, 2002, Hiramatsu
U.S. Appl. No. 10/009,174, filed Dec. 10, 2001, Hiramatsu et al.
U.S. Appl. No. 10/019,448, filed Apr. 8, 2002, Ito et al.
U.S. Appl. No. 09/926,800, Mar. 19, 2002, Hiramatsu et al.
U.S. Appl. No. 10/019,444, filed Apr. 23, 2002, Hiramatsu et al.
U.S. Appl. No. 10/019,280, filed Apr. 22, 2002, Ito et al.
U.S. Appl. No. 10/019,311, filed Apr. 9, 2002, Hiramatsu et al.
U.S. Appl. No. 10/030,123, filed May 16, 2002, Hiramatsu et al.
U.S. Appl. No. 10/049,293, filed Apr. 30, 2002, Ito et al.
U.S. Appl. No. 10/069,943, filed Jul. 10, 2002, Ito et al.
U.S. Appl. No. 10/048,490, filed Apr. 30, 2002, Ito et al.
U.S. Appl. No. 10/048,979, filed Apr. 26, 2002, Hiramatsu et al.
U.S. Appl. No. 10/048,989, filed May 29, 2002, Hiramatsu et al.
U.S. Appl. No. 10/069,511, filed Jun. 24, 2002, Ito et al.
U.S. Appl. No. 10/069,510, filed Jun. 20, 2002, Hiramatsu et al.
U.S. Appl. No. 10/070,443, filed Jun. 24, 2002, Hiramatsu et al.
U.S. Appl. No. 10/070,441, filed Jun. 26, 2002, Ito et al.
U.S. Appl. No. 10/088,098, filed May 30, 2002, Ito et al.
U.S. Appl. No. 10/088,100, filed Jun. 26, 2002, Ido.
U.S. Appl. No. 10/118,967, filed Apr. 10, 2002, Ito et al.
U.S. Appl. No. 10/111,980, filed Apr. 30, 2002, Ito et al.
U.S. Appl. No. 10/168,527, filed Jun. 28, 2002, Hiramatsu et al.

U.S. Appl. No. 10/181,724, filed Jul. 22, 2002, Hiramatsu et al.
U.S. Appl. No. 10/226,160, filed Aug. 23, 2002, Ito et al.
U.S. Appl. No. 10/229,177, filed Aug. 28, 2002, Hiramatsu et al.
U.S. Appl. No. 10/277,818, filed Oct. 23, 2002, Hiramatsu et al.
U.S. Appl. No. 10/311,368, filed Dec. 16, 2002, Ito et al.
U.S. Appl. No. 10/352,138, filed Jan. 28, 2003, Hiramatsu et al.
U.S. Appl. No. 10/346,095, filed Jan. 17, 2003, Ito et al.
U.S. Appl. No. 10/343,747, filed Feb. 6, 2003, Ito et al.
U.S. Appl. No. 09/806,478, filed Jul. 26, 2001, Ito et al.

* cited by examiner

CERAMIC HEATER AND MANUFACTURING METHOD OF CERAMIC HEATER

TECHNICAL FIELD

The present invention relates to a ceramic heater to be used mainly for production or examination of semiconductors in semiconductor industries and a manufacturing method of the ceramic heater.

BACKGROUND ART

Products for which a semiconductor is applied are very important products necessary for a variety of industries and a semiconductor chip, one of the most typical products among them is, for example, produced by slicing a single crystal silicon into a given thickness to manufacture a silicon wafer, and then forming various circuits thereon.

To form a variety of such circuits and the like, it is required to carry out steps of applying a photosensitive resin to a silicon wafer, exposing and developing the resin, and then subjecting the resulting resin to post curing treatment or to sputtering treatment to form a conductor layer. For these steps, the silicon wafer is required to be heated.

As such a kind of a heater for heating a semiconductor wafer such as a silicon wafer used in the condition of setting the semiconductor wafer thereon, conventionally those equipped with resistance heating elements such as electric resistors on the bottom face side of a substrate comprising aluminum are employed most, however the substrate comprising aluminum has a thickness of about 15 mm and therefore is heavy and bulky and not necessarily easy to be handled and insufficient in temperature controllability in terms of the temperature-following property to the electric current application to make even heating of a semiconductor wafer difficult.

In the publication of JP Kokai Hei 11-40330, there is disclosed a ceramic heater composed of a substrate of nitride ceramics or carbide ceramics with a high thermal conductivity and strength and heating elements formed by sintering a metal particle on the surface of a plate-like body (a ceramic substrate) comprising these ceramics.

Further, as for a heater to be employed for such a semiconductor producing device, the surface of the resistance heating elements thereof is easy to be affected by light and heat, treatment gases and the like when it is used as the semiconductor producing device, thus the resistance heating elements are required to have durability to oxidation on the surface.

Therefore, the inventors of the present invention have made investigations aiming to form a resistance heating element excellent in durability and consequently found that formation of an insulating covering on the resistance heating element formed on a ceramic substrate makes a ceramic heater excellent in durability, for example, anti-oxidation property and the like. However, the insulating covering may work also as a heat insulator for the resistance heating element, so that at the time of cooling after the ceramic heater is heated, quick cooling sometimes becomes impossible.

Further, as a method for forming the resistance heating element at the time of manufacture of such a ceramic heater, conventionally, the following methods have been employed; a method for forming the resistance heating element by a coating process such as screen printing; a method for forming the resistance heating element by a physical deposition method such as sputtering and a plating method after producing a ceramic substrate with a given shape.

In the case of a method for forming the resistance heating element using a coating method after producing a ceramic substrate with a given shape, a conductor containing paste layer in a heating element pattern is formed and successively heating and firing is performed to form the resistance heating element.

However, although the resistance heating element can be formed at a relatively low cost, such methods have a problem that the resistance heating element with a precise pattern can not be formed easily since trifling mistakes at the time of printing result in short-circuit in the case of producing a precise pattern. The above-mentioned method has another problem that the printing thickness is not even and subsequently, the resistivity becomes uneven.

Further, in the case of a method for forming the resistance heating element using a physical deposition method such as a sputtering and a plating method, after producing a ceramic substrate with a given shape, a metal layer is formed in a given area of the ceramic substrate by these methods and successively etching resist is formed so as to cover the portions on heating element patterns and then etching treatment is performed to form the resistance heating element in the given patterns, or at first the portions other than the heating element patterns are covered with resin and the like and then the above-mentioned treatment is carried out to form the resistance heating element in the given patterns on the surface of the ceramic substrate by one time treatment.

However, although this sputtering or the plating method and the like is capable of forming precise patterns, the method has a problem that etching resist or plating resist has to be formed on the ceramic substrate surface by a photolithographic technique in order to form the resistance heating element with given patterns, resulting in high cost.

As a method for solving these problems, a method has been employed which has an advantage that precise resistance heating element patterns can be formed at a relatively low cost, that is: a method comprising steps of forming a conductor layer in a strip-shaped or a ring-shaped with a given width and then removing the portions other than the heating element patterns using a laser beam irradiating equipment and the like to form precise heating element patterns; or a method including the steps of forming the resistance heating element by the above-mentioned method and successively irradiating laser beam to adjust the thickness of the resistance heating element or to remove some portion of the resistance heating element so as to precisely adjust the resistant value.

However, by a conventional screen printing and the like, the surface of the resistance heating element or the conductor layer is smooth and at the time of performing trimming by laser beam irradiation, in some cases, the laser beam is reflected at the surface of the resistance heating element. Consequently, it becomes impossible to perform trimming the resistance heating element or the conductor layer as designed, resulting in unevenness of the depth and the width.

SUMMARY OF THE INVENTION

Inventors of the present invention have made investigations for solving the problem that a ceramic heater cannot be cooled quickly and found that adjustment of the surface roughness of an insulating covering allows the insulating covering to function just like a heat releasing fin and thus drops the temperature of the resistance heating element at the time of cooling, as a result, quick temperature drop of the ceramic heater became possible, and completed the first aspect of the present invention.

A ceramic heater of the first aspect of the present invention is a ceramic heater comprising: a ceramic substrate; a resistance heating element, which is composed of one circuit or more circuits, disposed on a surface of a ceramic substrate; and an insulating covering provided on the resistance heating element, wherein said insulating covering has a surface roughness Ra of 0.01 to 10 μm, preferably 0.03 to 5 μm in accordance with JIS B 0601.

In the above-mentioned ceramic heater, since the surface roughness Ra of the surface of the above-mentioned insulating covering according to JIS B 0601 is adjusted at a range of 0.01 to 10 μm, the insulating covering functions to keep the temperature of the resistance heating element to some extent and at the same time if there exists a coolant in the surrounding, the roughened face formed on the insulating covering surface works as a heat releasing fin to carry out cooling at a relatively high speed.

Accordingly, at the time of raising the temperature of the ceramic heater, the temperature can be raised quickly and on the other hand, at the time of cooling after the temperature rise of the ceramic heater, the temperature of the resistance heating element can be dropped quickly and as a result, the ceramic heater can be cooled quickly.

Further, by adjustment of the surface roughness Ra of the insulating covering surface at a range of 0.03 to 5 μm, dispersion of the temperature rise speed can be made small.

Further, since the insulating covering is formed on the surface of the resistance heating element in stead of forming a metal covering by plating and the like, at the time of application of electric power of about 30 to 300 V to the resistance heating element, the inconvenience that electric current undesirably flows mainly at the surface of the resistance heating element does not take place, and the insulating covering can protect the resistance heating element. Further, even if the surface temperature of the resistance heating element is raised by electric power application, since the resistance heating element is covered with the insulating covering, oxidation or sulfurization by oxygen and $SO_X$ and the like in air scarcely proceeds and change of the resistance of the resistance heating element can be prevented.

The reason why electric current flows easily in a plated portion in the case the resistance heating element is covered by plating is that there is a difference between: the resistance of the resistance heating element; and the resistance of the plated portion and in such a case, the resistance value of the resistance heating element is required to be small. However, in the case that the resistance heating element is covered with the insulating covering, since the covering is an insulator, no electric current flows in the covered portion and thus, the resistance value of the resistance heating element can be set high and accordingly the calorific value can be designed to be high; or the cross-section of the resistance heating element can be made small to obtain the same heat calorific value.

If the surface roughness Ra of the above-mentioned insulating covering surface is less than 0.01 μm, the heat releasing function of the insulating covering deteriorates, so that the cooling speed is retarded at the time of cooling the ceramic heater and on the other hand, if the surface roughness Ra of the above-mentioned insulating covering surface exceeds 10 μm, air easily stagnates in the valley parts of the roughened surface, so that the cooling speed is retarded. In order to obtain the insulating covering provided with both of such heat insulating effect and heat releasing effect, the surface roughness Ra of the above-mentioned insulating covering is preferably 0.03 to 5 μm. This is because dispersion of the temperature rise speed becomes small. If Ra is less than 0.03 μm, heat reflection is high at the interface between the insulating covering and air and on the contrary, if Ra exceeds 5 μm, the effect of the heat release becomes significant to result in dispersion of the temperature rise speed. Incidentally, Ra is calculated by dividing the integrated value of absolute value of the surface roughness curve by the measured length, whereas Rmax is the height difference between a mountain part and a valley part in the curve of the surface roughness and both have no mutual correlation.

In the case the above-mentioned insulating covering is formed in a stretch of area containing a portion on which the circuits are formed so as to cover the resistance heating element comprising, especially two or more circuits, in a lump, the above-mentioned effects are provided and besides, occurrence of short-circuit and the like in the resistance heating element owing to the migration of a metal (for example, silver and the like) constituting the resistance heating element can be prevented. Further, also in the case of forming the insulating covering in the above-mentioned areas, the covering layer can easily be formed by screen printing and the like in the entire area including the portions where the above-mentioned circuits are formed, resulting in the decrease of covering cost and cost down of the heater.

The ceramic substrate constituting the ceramic heater of the first aspect of the present invention preferably comprises a nitride ceramic or a carbide ceramic. Because the nitride ceramic and the carbide ceramic are excellent in the thermal conductivity for transmitting generated heat of the resistance heating element and excellent in corrosion resistance to a treatment gas in a semiconductor producing device and therefore suitable for a substrate for a heater.

In the ceramic heater of the first aspect of the present invention, the insulating covering may comprise an oxide type glass. Because the oxide type glass to be employed for these purposes has a high adhesion strength to the ceramic substrate and to the resistance heating element and is chemically stable and excellent in electric insulation property.

Further, in the ceramic heater of the first aspect of the present invention, the insulating covering can comprise a heat resistant resin material. Because the heat resistant resin material usable for these purposes also has a high adhesion strength to the ceramic substrate and to the resistance heating element and is excellent in electric insulation property and can be formed at a relatively low temperature. Incidentally, heating resistance means usability at 150° C. or more.

As the heat resistant resin material, one kind or more selected from a polyimide type resin and a silicone type resin can be selected.

Further in the ceramic heater of the first aspect of the present invention, a heating face is a side opposed to the side on which the resistance heating element is formed and a semiconductor wafer is preferable to be heated on the heating face. It is because the heat generated by the resistance heating element is diffused while it is transmitted through the ceramic substrate, so that the temperature distribution similar to the resistance heating element patterns is hardly formed and a heat evenness property of the heating face can be assured.

The semiconductor wafer may be placed on the heating face. Also, through holes or concave portions may be formed in the ceramic substrate surface and then, supporting pins may be installed in the through holes or the concave portions so as to slightly project out of the ceramic substrate surface in order to hold the semiconductor wafer in the condition that it is kept at 5 to 2000 μm from the heating face by the supporting pins for heating.

Incidentally, in the publication of JP Kokai Hei 6-13161, the structure of a ceramic substrate covered with resin is disclosed, however the idea disclosed in the publication is that an object to be heated is put on a resistance heating element and thus, completely different from that of the present invention.

Further, Japanese Patent gazette No. 2724075 disclosed a method for covering the surface of an aluminum nitride sintered body with a metal layer which is formed by: depositing an alkoxide, a metal powder, and a glass powder on the surface of the aluminum nitride sintered body; and firing them. However, this patent relates to a package substrate and has no description or implication that: the metal layer is a resistance heating element; the opposite side of the face on which the resistance heating element is formed is used as the heating face; and the insulating covering is formed on the resistance heating element. Therefore, the novelty and unobviousness of the present invention cannot be denied.

The ceramic heater of the first aspect of the present invention may comprise a cooling device. The cooling device includes air-cooling device or water-cooling device and the like which are using a coolant. The heat exchange may be carried out: by conducting direct blowing of the coolant to the ceramic substrate; or by laying a cooling pipe in the inside of the device or the ceramic substrate.

As the coolant, gases such as air, nitrogen, argon, helium, and carbon dioxide can be used and other than these, liquids such as water, ammonia, ethylene glycol and the like are also usable.

The ceramic heater of the first aspect of the present invention has similar effects even in the case of carrying out the cooling.

Further, inventors of the present invention have enthusiastically made investigations for solving the problem that the resistance heating element or the conductor layer cannot be trimmed as designed at the time of performing trimming using laser beam in the ceramic heater manufacture and consequently found that: in the condition that a surface roughness Ra of the resistance heating element or the conductor layer is 0.01 μm or more in accordance with JIS B 0601 at the time of the formation of the resistance heating element or the conductor layer on the surface of the ceramic substrate, the laser beam reflection can be prevented and accordingly the resistance heating element or the conductor layer can be trimmed almost as designed without unevenness, and finally completed the manufacturing method of the present invention.

That is, a manufacturing method of a ceramic heater of a second aspect of the present invention is a manufacturing method of a ceramic heater comprising the steps of: forming a resistance heating element having a given pattern on a surface of a ceramic substrate; and irradiating laser beam on to the resistance heating element to form a gutter or a cut after the preceding step so as to adjust a resistance value of the resistance heating element, wherein when the resistance heating element is formed on the surface of the ceramic substrate, a surface roughness Ra of the resistance heating element is 0.01 μm or more in accordance with JIS B 0601.

Further, a manufacturing method of a ceramic heater of a third aspect of the present invention is a manufacturing method of a ceramic heater comprising the steps of: forming a strip-shaped or a ring-shaped conductor layer on a given area of a surface of a ceramic substrate; and irradiating laser beam onto the conductor layer to remove a part of the conductor layer by performing trimming after the preceding step so as to form a resistance heating element having a given pattern, wherein when the conductor layer is formed on the surface of the ceramic substrate, a surface roughness Ra of the conductor layer is 0.01 μm or more in accordance with JIS B 0601.

In the manufacturing methods of the second and the third aspect of the present inventions, since the surface roughness Ra of the resistance heating element or the conductor layer on the ceramic substrate surface according to JIS B 0601 is adjusted to be 0.01 μm or more, laser beam reflection can be prevented and thus the laser beam can be absorbed in the resistance heating element or conductor layer and as a result, the resistance heating element or the conductor layer can be trimmed as designed.

If the surface roughness Ra of the resistance heating element or the conductor layer on the ceramic substrate surface according to JIS B 0601 is less than 0.01 μm, laser beam is reflected, so that the energy is diffused and gutters and cuts smaller than those designed are formed, and it results in too smaller resistance value of the resistance heating element than a designed value or formation of the resistance heating element in different patterns (width) from designed patterns. In order to keep the laser beam absorption efficiency high, the surface roughness of the above-mentioned conductor layer is preferably 0.1 to 10 μm.

Further, according to the manufacturing method of the ceramic heater of the second aspect of the present invention, since the resistance value is adjusted using laser beam, the resistance value can precisely be adjusted with little unevenness of the depth and width within a relatively short time and consequently, the temperature of the face for heating a semiconductor wafer and the like (hereinafter, referred to a heating face) can be made even to make it possible to evenly heat an object to be heated such as a semiconductor wafer.

Further, according to the manufacturing method of the ceramic heater of the third aspect of the present invention, resistance heating element patterns with little unevenness of the depth and width can be formed within a relatively short time and the manufacturing cost can be lowered and complicated and precise patterns can be formed.

Accordingly, the ceramic heater having such resistance heating element patterns is relatively economical, has complicated and precise patterns and is capable of keeping the temperature of the heating face precisely even.

A ceramic heater of a fourth aspect of the present invention is a ceramic heater comprising a resistance heating element formed on a surface of a ceramic substrate, wherein a gutter or a cut is formed at a part of the resistance heating element, and the resistance heating element has a surface roughness Ra of 0.01 μm or more in accordance with JIS B 0601.

Since the ceramic heater has a high surface roughness of the resistance heating element surface, the atmosphere gas can be stagnated, and thus air in the gutter or cuts of the resistance heating element is prevented from flowing, and consequently, formation of low temperature portion attributed to the cuts or gutters is suppressed. Accordingly, the temperature evenness of the heating face can further be improved.

Even in the case laser trimming is performed, when low temperature spots are formed owing to the cuts or gutters, the temperature distribution in the heating face becomes wide even if the resistance value unevenness is made small, however in the ceramic heater of the fourth aspect of the present invention, such a problem is solved by making the surface roughness of the resistance heating element surface high.

If the surface roughness Ra of the resistance heating element surface is less than 0.01 μm, the atmosphere gas on the surface of the resistance heating element flows, so that the effect to prevent low temperature spot formation by the cuts or gutters cannot be achieved.

The resistance heating element is preferable to be covered by an insulating layer. In the case a covering layer (glass or resin) is formed on the resistance heating element surface, in the case the surface roughness of the resistance heating element is higher, the cracking by thermal impact is more difficult to take place.

Incidentally, in the manufacturing methods of the second and third aspect of the present inventions and the ceramic heater of the fourth aspect of the present invention, the surface roughness Ra of the resistance heating element surface is preferably 15 μm or less. Because if it exceeds 15 μm, unevenness of the width of the gutters or cuts increases owing to the diffused reflection of a laser beam.

Further, if the surface roughness Ra of the resistance heating element surface exceeds 15 μm, the quantity of heat escaping to the atmosphere gas from the resistance heating element surface increases, so that the temperature distribution in the heating face becomes large.

Further, if the surface roughness of the resistance heating element exceeds 15 μm, on the contrary, cracks are easy to be formed in the covering layer owing to thermal impact.

Explanation of Symbols

| | |
|---|---|
| 10, 20 | a ceramic heater |
| 11, 21 | a ceramic substrate |
| 11a, 21a | a heating face |
| 11b, 21b | a bottom face |
| 12, 22, (22a, 22b, 22c, 22d) | a resistance heating element |
| 13, 23 | an external terminal |
| 14, 24 | a bottomed hole |
| 15, 25 | a through hole |
| 16 | a lifter pin |
| 17, 27 (27a, 27b, 27c, 27d) | an insulating covering |
| 19 | a silicon wafer |
| 110, 140 | a ceramic heater |
| 111, 141 | a ceramic substrate |
| 111a | a heating face |
| 111b | a bottom face |
| 112 (112a to 112g), 142 (142a to 142d) | a resistance heating element |
| 1120 | a metal covering layer |
| 1130 | a gutter |
| 110 | a laser trimming stage |
| 110b | a projection for fixation |
| 110c | a stage |
| 112m | a conductor layer |
| 114 | a laser irradiating equipment |
| 115 | a galvanomirror |
| 116 | a motor |
| 117 | a control unit |
| 118 | a memory unit |
| 119 | a computation unit |
| 120 | an input unit |
| 121 | a camera |
| 133 | an external terminal |
| 134, 44 | a bottomed hole |
| 135, 45 | a through hole |
| 136 | a lifter pin |
| 139 | a silicon wafer |

DETAILED DISCLOSURE OF THE INVENTION

At first, an embodiment of a ceramic heater of the first aspect of the present invention will be described with the reference of figures.

Figure 1:
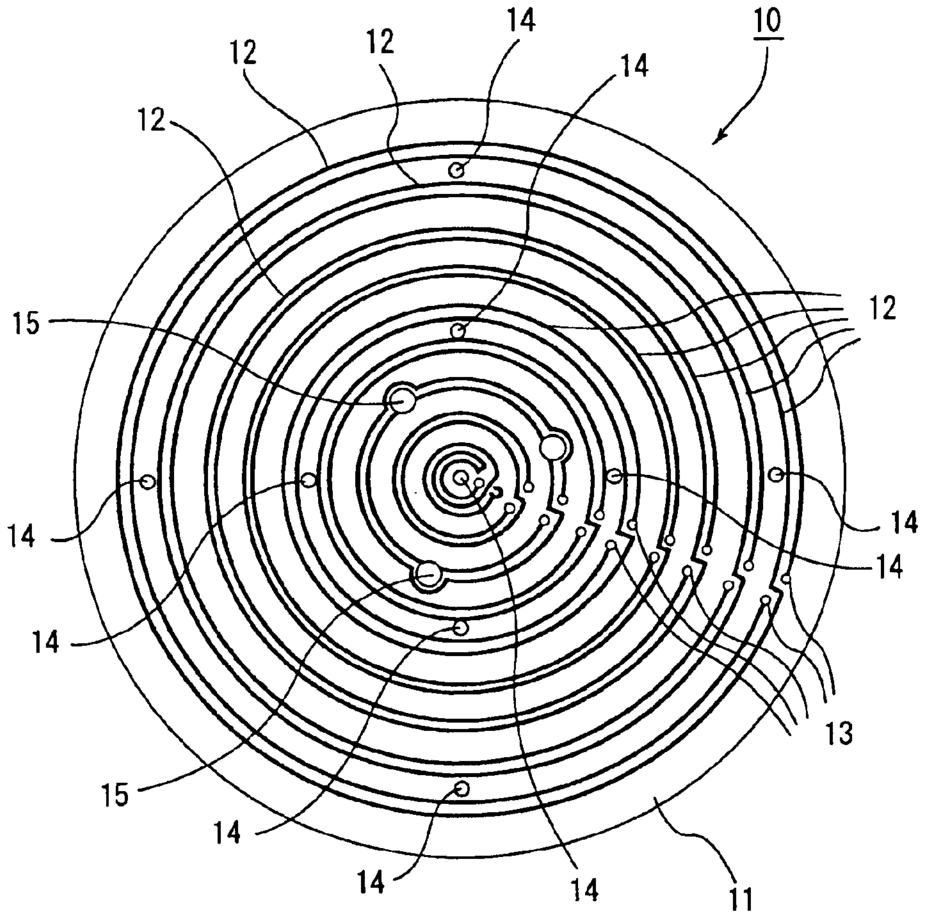
FIG. 1 is a bottom plane view schematically showing one embodiment of a ceramic heater according to the first aspect of the present invention.
Figure 2:
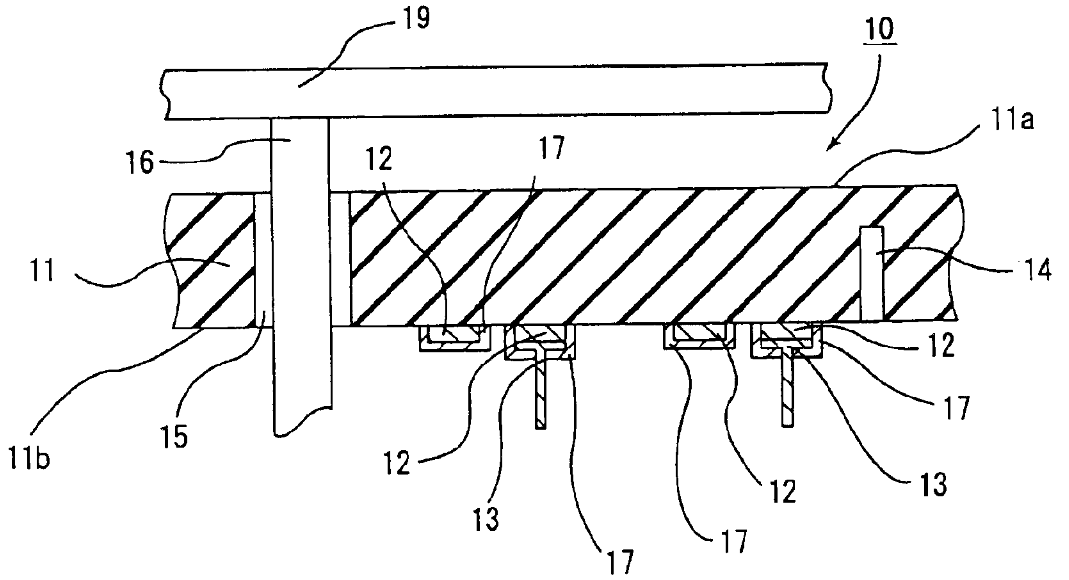
FIG. 2 is an enlarged figure of a portion of the ceramic heater illustrated in FIG. 1.

FIG. 1 is a bottom face view schematically showing one embodiment of a ceramic heater of the present invention and FIG. 2 is a partially enlarged figure of the above-mentioned ceramic heater.

The ceramic heater 10 comprises a disk-like ceramic substrate 11 which is made of an insulating nitride ceramic or carbide ceramic. Approximately linear resistance heating elements 12, for example, in concentrically circular state as shown in FIG. 1, are formed on one main face of the ceramic substrate 11; and the other main face (hereinafter, referred to as a heating face) 11*a* is made to be a face for: putting an object to be heated such as a silicon wafer 19 thereon; or holding the object at a given distance from the heating face 11*a* to heat the object.

As illustrated in FIG. 2, through holes 15 are formed in the vicinity of the center of the ceramic substrate 11 and lifter pins 16 are inserted into the through holes 15 to support the silicon wafer 19. Also, at bottom faces 11*b*, bottomed holes 14 to insert a temperature measurement element such as a thermocouple into are formed.

In this ceramic heater 10, as illustrated in FIG. 2, an insulating covering 17 with a given thickness and a surface roughness Ra of the surface being 0.01 to 10 μm is formed on the surface part of the resistance heating element 12, so that the durability such as oxidation resistance, sulfurization resistance and the like is improved. Incidentally, in the ceramic heater 10, external terminals 13 are connected to the terminal parts of the resistance heating element 12 and the insulating covering 17 is formed also on a portion of the external terminals 13. In such a case, generally, the insulating covering 17 is formed after the external terminals 13 are connected to the terminal parts of the resistance heating element 12.

In the case the insulating covering 17 is formed before connection of the external terminals 13, the insulating covering 17 cannot be formed at the portions where the external terminals 13 are connected. Accordingly, in such a case, the portions at which the external terminals 13 are connected are generally not covered with the insulating covering 17. Accordingly, after the connection of the external terminals 13, coating may be carried out again to form the insulating covering 17 on the portions at which the external terminals 13 are connected.

Conventionally, in the case of a heater including a resistance heating element formed on the surface of a ceramic substrate, there is an disadvantageous point need to be improved such that heat is released from the exposed surface of the resistance heating element, and accordingly the temperature of the heating face is not so raised for the applied electric power, whereas in the present invention, since the insulating covering 17 with a surface roughness Ra of 0.01 to 10 μm is formed, the heat diffusion from the resistance heating element 12 can appropriately be carried out.

That is, since the resistance heating element is covered with the insulating covering having: the above-mentioned surface roughness; and proper thermal insulation effect, at the time of heating the ceramic substrate, heat is radiated at a high efficiency for the applied power to keep a high surface temperature. Further, in the case a coolant exists in the surrounding, the roughened face formed on the insulating covering surface functions as a heat releasing fin, so that the resistance heating element can quickly be cooled and as a result, prompt cooling of the ceramic heater can be achieved.

If the surface roughness Ra of the insulating covering surface is less than 0.01 μm, the thermal insulation effect is so significant that efficient rise of the temperature is possible at the time of raising the temperature of the ceramic substrate, however at the time of dropping the temperature after heating of a silicon wafer and the like, the temperature dropping speed of the resistance heating element is retarded and it is made impossible to repeat temperature rise and drop efficiently within a short time.

On the other hand, if the surface roughness Ra of the insulating covering surface exceeds 10 μm, air easily stagnates in valleys of the roughened surface and also since the thermal conductivity of the insulating covering is low, the function as a heat insulation material becomes more significant than the effect as the heat releasing fin, making cooling efficiently within a short time impossible.

As the insulating covering 17, an oxide-based glass material or an electrically insulating synthetic resin (hereinafter, referred to heat resistant resin) having thermal resistance such as polyimide type resin and silicone type resin can be employed. These materials may be used alone or in combination (in layered form and the like) of two or more kinds of them. Incidentally, these materials will be described later.

Hereinafter, an instance of using aluminum nitride sintered body substrate as a base material of the ceramic substrate is described, however the described base material is of course not limited to aluminum nitride and as the material examples, carbide ceramics, oxide ceramics, nitride ceramics other than aluminum nitride, and the like can be exemplified.

Examples of the above-mentioned carbide ceramics include, for example, metal carbide ceramics such as silicon carbide, zirconium carbide, titanium carbide, tantalum carbide, and tungsten carbide and the like, and examples of the above-mentioned oxide ceramics includes metal oxide ceramics such as alumina, zirconia, cordielite, mullite and the like. Further, examples of the above-mentioned nitride ceramics include metal nitride ceramics such as aluminum nitride, silicon nitride, boron nitride, and titanium nitride and the like.

Among these ceramic materials, generally, nitride ceramics and carbide ceramics have a higher thermal conductivity and therefore they are more preferable than oxide ceramics. Incidentally, the materials of these materials for a sintered substrate may be used alone or in combination with two or more of them.

The ceramic heater comprising the nitride ceramics typically aluminum nitride and other carbide ceramics does not warp or strain by heating even if the thickness is thin because these ceramic materials have a smaller thermal expansion coefficient than that of a metal and also because ceramic materials have high rigidity. Thus, the heater substrate can be made thinner and lighter by weight than that made of a metal material such as aluminum and the like. Above all, since aluminum nitride is excellent in thermal conductivity, scarcely affected by light and heat in a semiconductor producing device and excellent also in corrosion resistance to treatment gas, aluminum nitride can be employed preferably as a heater material.

An insulating layer may be formed on the surface of the ceramic substrate comprising the above-mentioned nitride ceramics and carbide ceramics.

That is because, in the case ceramic substrate itself has a high conductivity at a room temperature or a resistance thereof decreases when the temperature thereof is in a high temperature region, if the resistance heating element is formed directly on the ceramic substrate surface, current leakage occurs between neighboring resistance heating element patterns and it results in incapability of functioning as a heater in some cases.

In this case, an insulating layer is to be formed on the ceramic substrate surface, then a resistance heating element is to be formed on the insulating layer, and further an insulating covering is to be formed on the resistance heating element.

As the insulating layer, for example, an oxide ceramic is used. Such an oxide ceramic includes, for example, silica, alumina, mullite, cordielite, beryllia and the like. These oxide ceramics can be used alone or in combination of two or more of them.

As a method for forming an insulating layer comprising these materials, for example, a method using a sol solution obtained by hydrolysis of alkoxides, forming a covering layer by spin coating and the like and then drying and firing the covering layer. Further, the insulating layer may be formed by CVD and sputtering and also the insulating layer can be formed by applying a glass powder paste and then firing the paste at 500 to 1000° C.

The resistance heating element 12 is formed by forming a conductor containing paste layer in given patterns by applying a conductor containing paste containing metal particles of a noble metal (gold, silver, platinum, palladium), lead, tungsten, molybdenum, nickel and the like and then sintering the metal particles by baking. The sintering of the metal particle is sufficient if the metal particles are fused to one another and the metal particles are stuck to the ceramic substrate. Incidentally, the resistance heating element 12 may be formed by using conductive ceramic particles of tungsten carbide, molybdenum carbide and the like.

At the time of forming the resistance heating element 12, the resistance value can variously be set by controlling the shape (the line width and the thickness). Further, as being known well, if the width is adjusted to be narrower or the thickness is made thinner, the resistance value can be increased. The resistance heating element is in form of approximately linear or winding line with a certain width, however it is not required to be strictly linear or winding from a geometric point of view and may be in form of combination of straight lines and winding lines.

Since the oxide type glass material, which a material of the insulating covering, has a high electric insulation property itself as a material and a high adhesion strength to the ceramic substrate and to the resistance heating element and is chemically stable, it can form a stable interface to the ceramic substrate and interface to the resistance heating element.

Examples of its practical composition includes, for example, $ZnO—B_2O_3—SiO_2$ which is containing ZnO as a main component, $PbO—SiO_2$, $PbO—B_2O_3—SiO_2$, and $PbO—ZnO—B_2O_3$ which are containing PbO as a main component. These oxide type glass materials may have crystalline portions. The glass transition point of the glass material is 400 to 700° C. and the thermal expansion coefficient is 4 to 9 ppm/° C.

As a method for forming the insulating covering of such oxide type glass materials, a method for forming the insulating covering by applying a paste containing the above-mentioned oxide type glass powder to the ceramic substrate surface by screen printing and drying and firing can be exemplified. In this case, the portions where external terminals are formed are required to be covered with a layer of resin relatively easy to be decomposed at the time of heating so as to avoid the formation of the insulating covering.

At that time, the surface roughness of the insulating covering can be adjusted by changing the drying condition (drying speed), firing condition (firing temperature), or the average particle diameter of the glass powder. Further, the surface roughening may be carried out by forming the insulating covering and then carrying out sand blast treatment of the surface.

Further, a heat resistant resin material, which is a material for the insulating covering, also has an excellent electric insulation property and a high adhesion strength to the ceramic substrate and to the resistance heating element. Further, use of the heat resistant resin material makes formation of the insulating covering at a relatively low temperature possible. In the case of forming the insulating covering, it is only required to apply the material to the resistance heating element surface and dry and solidify the material, so that formation is easy and economical. Incidentally, the thermal resistance means that it can be used at a temperature of 150° C. or more and in such a case, no deterioration of polymers and the like takes place.

Its practical examples include, for example, polyimide type resin, silicone type resin and the like. The polyimide type resin is polymer compounds obtained by the reaction of the carboxylic acid derivatives and diamines and has thermal resistance at 200° C. or more and can be used in a wide temperature range. Further, the silicone type resin comprises methyl and ethyl as an alkyl in the side chains of polysiloxanes and is excellent in thermal resistance and at the same time has rubber elasticity, good adhesion property to the resistance heating element and the ceramic substrate and is capable of forming the insulating covering by being dried and solidified at a relatively low temperature, that is about 150 to 250° C.

As a method for forming an insulating covering comprising such a heat resistant resin material, a method comprising applying or spraying a paste containing the above-mentioned heat resistant resin material dissolved in a solvent and the like to the ceramic substrate surface and drying the material can be exemplified.

In this case, the surface roughness of the insulating layer can be adjusted by changing the drying condition (drying speed) and changing the spraying condition and the like. Or, a roughened face may be formed by carrying out sand blast treatment of the surface or treatment using a belt sander after the formation of the insulating covering.

In this ceramic heater 10, the insulating covering 17 is formed on the surface portion of the resistance heating element 12 and the thickness of the insulating covering 17 is preferably 5 to 50 μm in the case of the oxide glass and 10 to 50 μm in the case of the heat resistant resin.

That is because, in the ceramic heater 10, cooling is required after heating in order to turn it to a normal temperature and if the thickness of the insulating covering 17 is too thick, cooling takes too long, and consequently it results in productivity deterioration and on the contrary, if it is too thin, the oxidation resistance of the resistance heating element is lowered and the temperature of the heating face is lowered attributed to heat release from the exposed resistance heating element surface.

As described above, if the insulating covering is formed on the resistance heating element surface, since these materials are excellent in the electric insulation property, it never occurs that electric current leaks out of the insulating covering and flows and they can protect the resistance heating element surface even in the case electric power about 30 to 300 V is applied to the resistance heating element.

Further, the above-mentioned ceramic substrate has a high thermal conductivity and therefore can be formed to be thin in the thickness, so that the surface temperature of the ceramic substrate can promptly respond to the temperature change of the resistance heating element and as a result, the ceramic heater 10 becomes excellent in temperature controllability and the durability.

Figure 3:
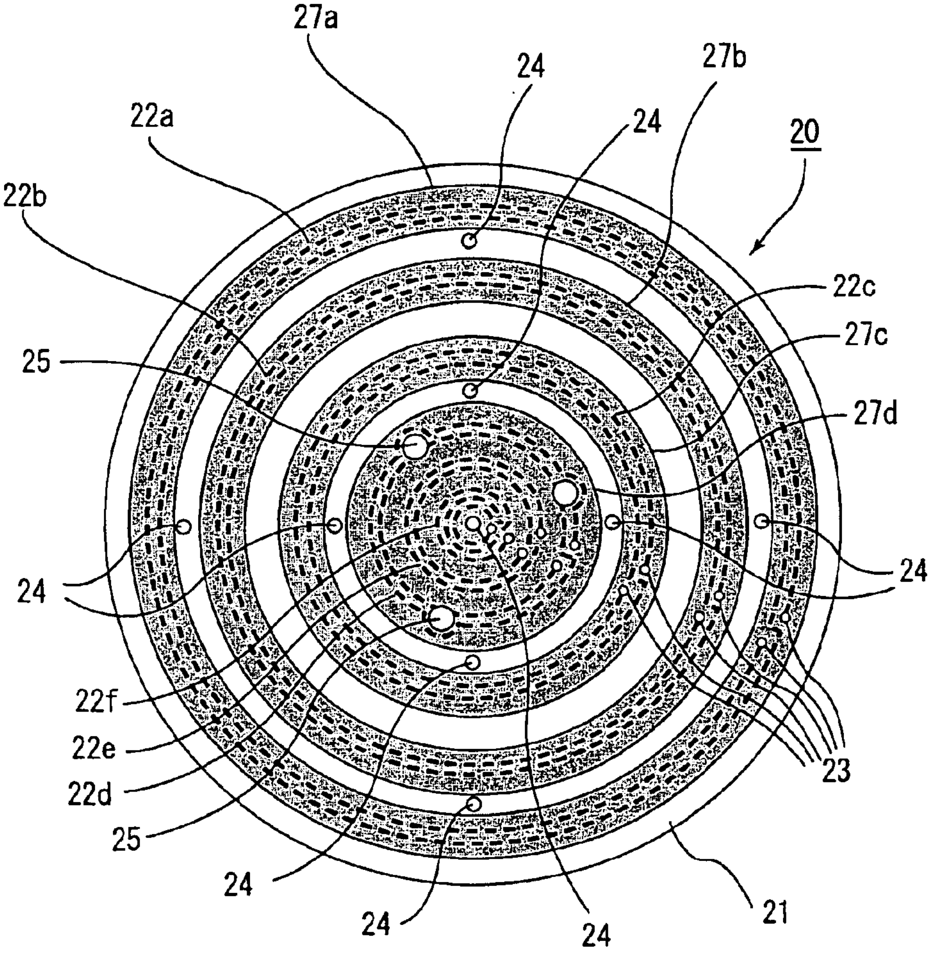
FIG. 3 is a bottom plane view schematically showing another embodiment of a ceramic heater according to the first aspect of the present invention.
Figure 4:
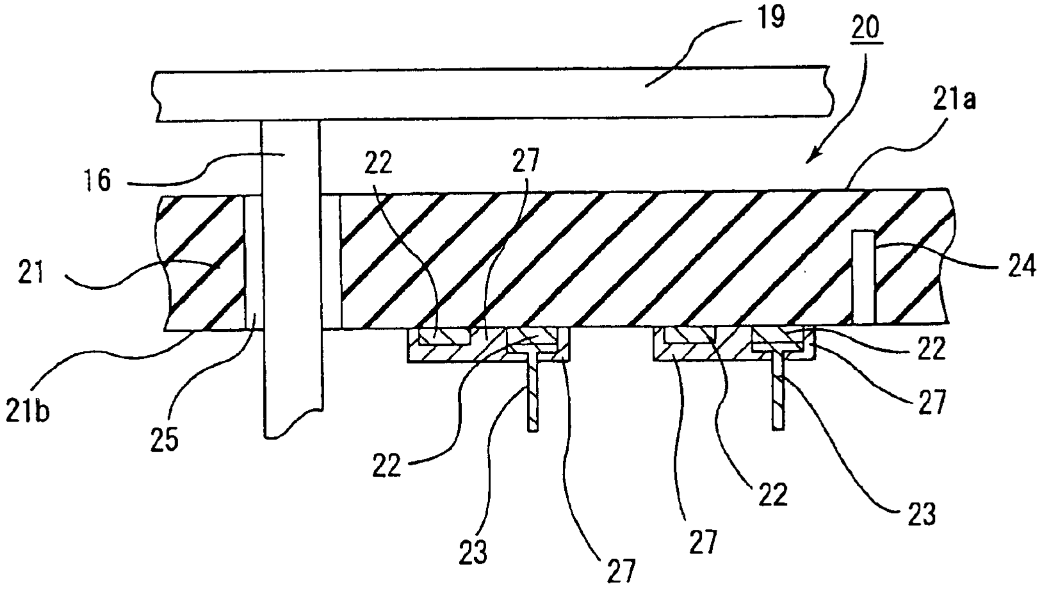
FIG. 4 is an enlarged figure of a portion of the ceramic heater illustrated in FIG. 3.

FIG. 3 is a bottom face view schematically showing another embodiment of a ceramic heater of the present invention and FIG. 4 is a partially enlarged cross-sectional view of the above-mentioned ceramic heater.

The ceramic heater 20 comprises a plate-like ceramic substrate 21, similarly to the case of the ceramic heater 10 shown in FIG. 1. The resistance heating elements 22 (22*a* to 22*f*) having approximately linear state concentrically as shown in FIG. 1 are formed on one main face of the ceramic substrate 21 so as to form circuits; and the other main face thereof is made to be a face to put an object to be heated thereon or sustain it to heat the object.

Further, in the ceramic heater 20, the insulating coverings are formed on a stretch of area containing a portion on which the above-mentioned circuits are formed. That is, around the resistance heating element 22*a*, 22*b*, 22*c* at which the circuits are kept at relatively wide distances from one another, the insulating covering 27*a*, 27*b*, 27*c* are formed on a stretch of area containing a portion on which the above-mentioned circuits are formed and the surroundings thereof, on the other hand, around the resistance heating elements 22*d*, 22*e*, 22*f* which are kept at narrow gaps from one another, the insulating covering 27*d* is formed on the entire area comprising: the areas sandwiched between the neighboring resistance heating elements constituting the circuits; their surrounding areas; and the areas between the respective neighboring circuits.

In the ceramic heater 20 with such a constitution, the same effect as that of the case of the ceramic heater 10 shown in FIG. 1 is provided and occurrence of short-circuit between neighboring circuits owing to migration of a metal particle (for example, silver particle) contained in the resistance heating element 22 can be prevented. Further, at the time of forming the insulating covering 27, the insulating covering 27 can be formed by forming a covering layer in a given area by screen printing and the like and heating the covering layer, so that the insulating covering can relatively easily and efficiently be formed and the covering cost is lowered to result in an economical heater.

As the insulating covering 17 similar to the case of the ceramic heater shown in FIG. 1, either an oxide type glass material or heat resistant resin of such as polyimide type resin, silicone type resin can be employed.

Further, similar to the case of the ceramic heater shown in FIG. 1, as the material of the base material of the ceramic substrate, for example, carbide ceramics, oxide ceramics, nitride ceramics and the like can be employed.

Also, for the material of the resistance heating element 22, similar materials to those in the case of the ceramic heater 10 shown in FIG. 1 can be used and the resistance heating element 22 can be formed by a similar method to that in the case of the ceramic heater 10 shown in FIG. 1.

In the ceramic heater 20, the thickness of the insulating covering 27 (the thickness from the surface of the resistance heating element 22) is preferably same as that in the case of the ceramic heater 10 shown in FIG. 1 and the thickness from the bottom face of the ceramic substrate 21 at the portion where no resistance heating element 22 is formed is preferably 10 to 50 μm in the case of oxide glass and 10 to 50 μm in the case of heat resistant resin.

Figure 5:
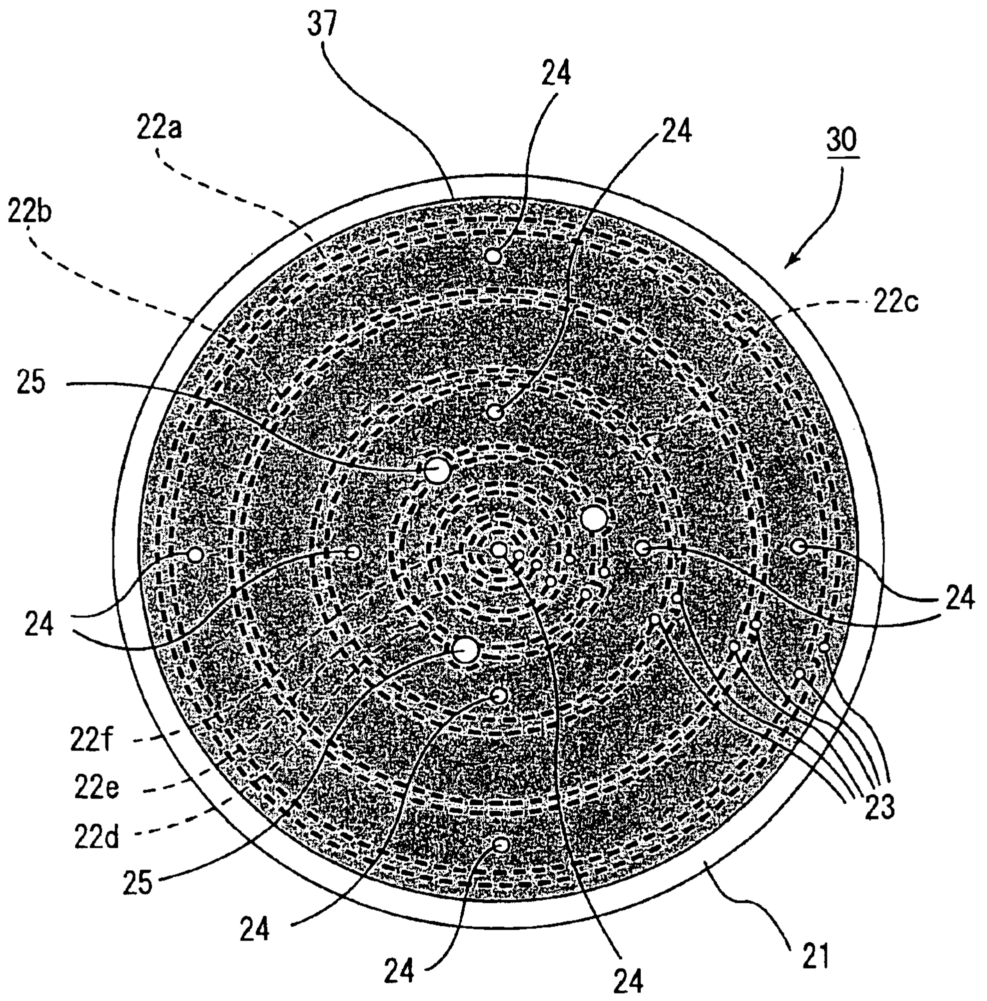
FIG. 5 is a bottom plane view schematically showing further another embodiment of a ceramic heater according to the first aspect of the present invention.
Figure 6:
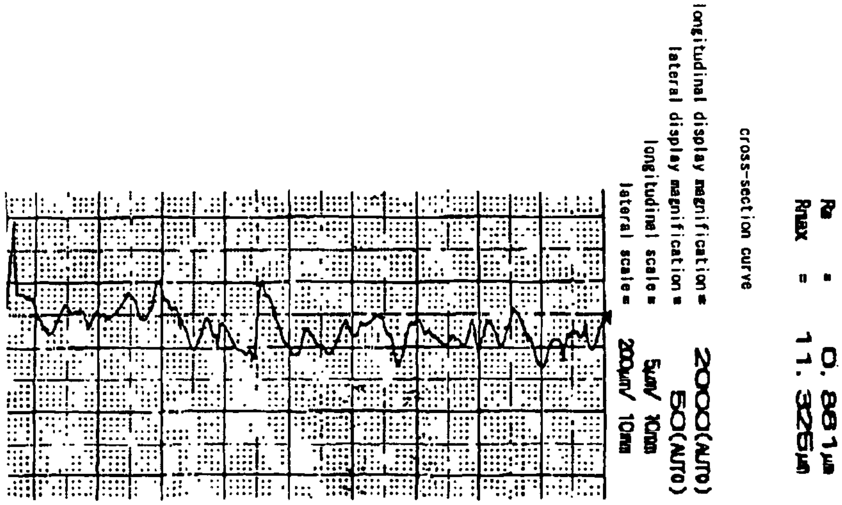
FIG. 6 is a graph showing the measurement results of the surface roughness of an insulating covering constituting the ceramic heater according to Example 1.
Figure 7:
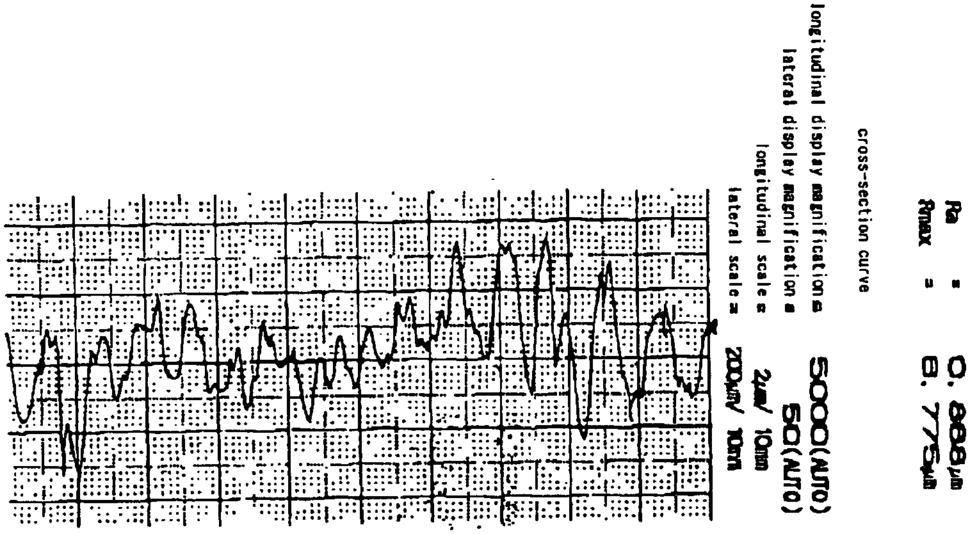
FIG. 7 is a graph showing the measurement results of the surface roughness of an insulating covering constituting the ceramic heater according to Example 2.
Figure 8:
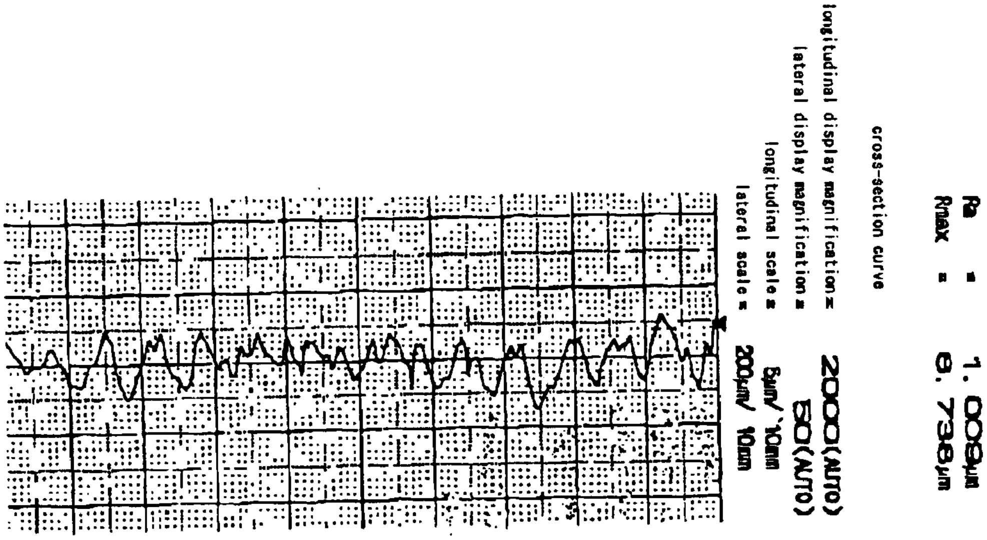
FIG. 8 is a graph showing the measurement results of the surface roughness of an insulating covering constituting the ceramic heater according to Example 3.
Figure 9:
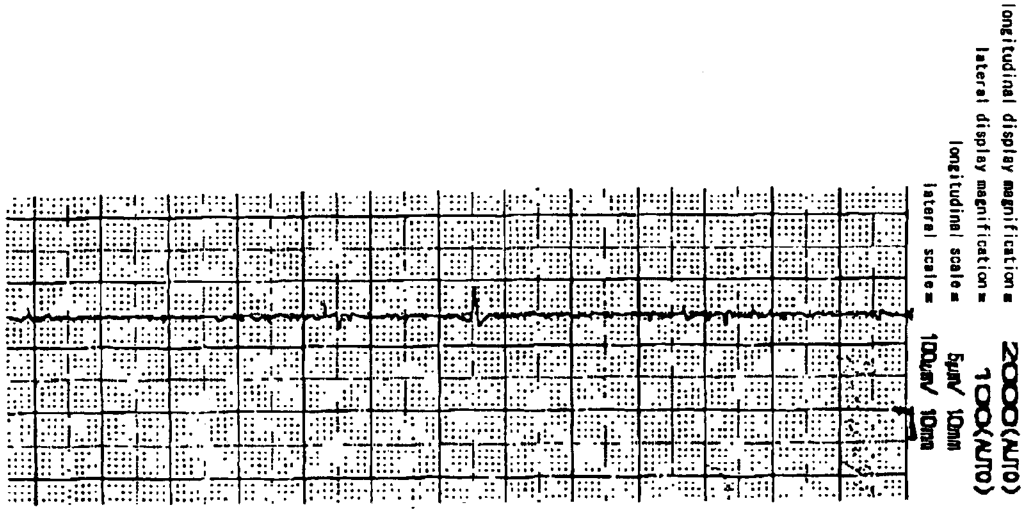
FIG. 9 is a graph showing the measurement results of the surface roughness of an insulating covering constituting the ceramic heater according to Example 4.
Figure 10:
FIG. 10 is a graph showing the measurement results of the surface roughness of an insulating covering constituting the ceramic heater according to Example 5.

FIG. 5 is a bottom face figure schematically showing further another embodiment of the ceramic heater of the present invention.

The ceramic heater 30 has the same structure as that of the ceramic heater 20 except that an insulating covering 37 is formed in the entire area where the resistance heating element 22 of the above-mentioned ceramic heater 20 is formed and the same effect as that of the ceramic heater 10 shown in FIG. 1 is provided and besides, occurrence of short-circuit and the like in the resistance heating element owing to the migration of a metal (for example, silver and the like) constituting the resistance heating element 22 can be prevented. Further, also in the case of forming the insulating covering 37, it can easily and effectively be formed because a coating layer is formed by screen printing and the like and the insulating covering 37 is formed by a heating it and the like, to result in a decrease of a covering cost and cost down of the heater.

As described above, the insulating covering in the present invention may include those having a variety of covering structures such as: the structure of covering only on the surface of circuits; the structure of covering a stretch of area containing a portion on which the circuits are formed: the structure of integrally covering two or more neighboring circuits in the diameter direction of the ceramic substrate in a lump; the structure of covering the whole area where the circuits are formed; and the like.

Practical examples of the ceramic heater of the first aspect of the present invention with such a constitution and their manufacturing method will be described as the best mode for carrying out the present invention later. Of course, the practical examples and the manufacturing method to be described later are only examples and the ceramic heater of the first aspect of the present invention is not limited only to these examples and the manufacturing method at all.

Next, manufacturing methods of ceramic heaters of the second and the third aspect of the present invention will be described.

The manufacturing method of a ceramic heater of the second aspect of the present invention is a ceramic heater manufacturing method comprising the steps of: forming a resistance heating element having a given pattern on a surf ace of a ceramic substrate; and irradiating laser beam onto the resistance heating element to form a gutter or a cut after the preceding step so as to adjust a resistance value of the resistance heating element, wherein when the resistance heating element is formed on the surface of the ceramic substrate, a surface roughness Ra of the resistance heating element is 0.01 μm or more in accordance with JIS B 0601.

The manufacturing method of a ceramic heater of the third aspect of the present invention is a ceramic heater manufacturing method comprising the steps of: forming a strip-shaped or a ring-shaped conductor layer on a given area of a surface of a ceramic substrate; and irradiating laser beam onto the conductor layer to remove a part of the conductor layer by performing trimming after the preceding step so as to form a resistance heating element having a given pattern, wherein when the conductor layer is formed on the surface of the ceramic substrate, a surface roughness Ra of the conductor layer is 0.01 μm or more in accordance with JIS B 0601.

There is a difference between both inventions: in the second aspect of the present invention, the resistance value of the resistance heating element is adjusted by performing trimming the resistance heating element formed in given patterns, whereas in the third aspect of the present invention, some portions of the above-mentioned conductor layer are removed by laser beam irradiation to form the resistance heating element patterns.

However, both inventions are in common in the point that laser beam is irradiated to a specified area of the ceramic substrate and the irradiated portions of the conductor layer (the resistance heating element) are removed and the same laser trimming equipment can be employed.

Accordingly, hereinafter, except the cases separate descriptions are necessary, the above-mentioned two inventions will be described in parallel.

At first, in the manufacturing methods of the second and the third aspect of the present inventions, the trimming method to be employed at the time of performing laser trimming will be described and successively the laser trimming using the equipment will be described.

Figure 11:
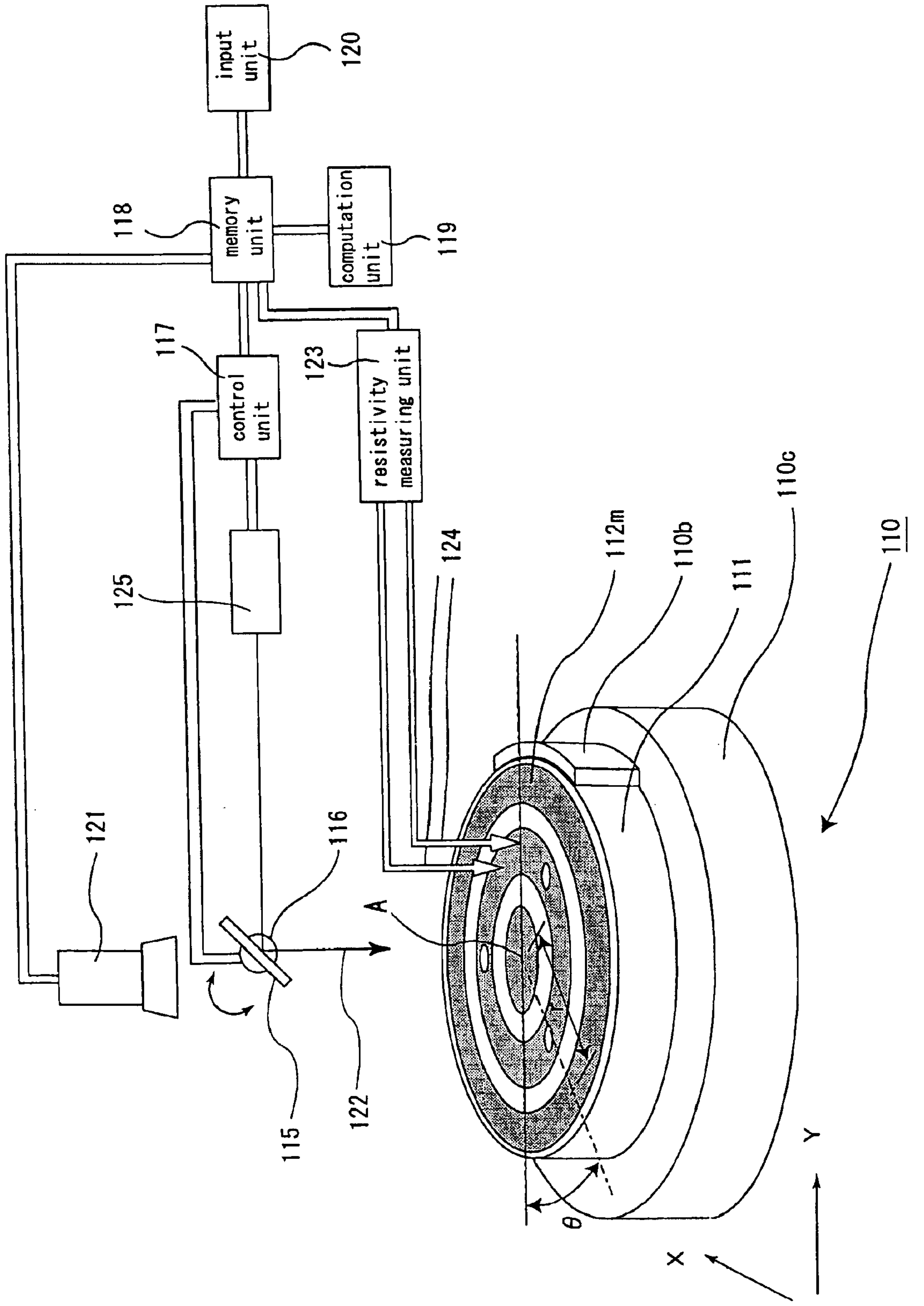
FIG. 11 is a block diagram schematically showing a laser trimming equipment to be employed for the manufacturing method of ceramic heaters of a second and a third aspect of the present inventions.

FIG. 11 is a block diagram showing the outline of the laser trimming equipment to be employed for the manufacturing methods of the second and the third aspect of the present inventions.

At the time of performing laser trimming, as shown in FIG. 11, a ceramic substrate 111 on which either a conductor layer 112*m* is formed in concentric circles (ring shapes) with a given width so as to include the circuits of the resistance heating element to be formed or a resistance heating element with given patterns are formed is fixed on a stage 110*c*.

On the stage 110*c*, a motor or the like (not illustrated) is installed and is connected to a control unit 117 and the motor or the like is driven by signals from the control unit 117 to make it possible to freely move the stage 110*c* in the θ direction (the turning direction of the ceramic substrate) and x-y directions.

On the other hand, above the stage 110*c*, a galvanomirror 115 is installed and the angle of the galvanomirror 115 is made freely changeable in the x-direction by the motor 116. The laser beam 122 irradiated from a laser irradiating equipment 114 installed also above the stage 10*c* comes into collision against the galvanomirror 115 and reflected thereon so as to irradiate the ceramic substrate 111.

Further, the motor 116 and the laser irradiating equipment 114 are connected to the control unit 117 and by the signals from the control unit 117, the motor 116 and the laser irradiating equipment 114 are driven so as to turn the galvanomirror at a given angle around the axis in the x-direction. Also, a motor (not illustrated) installed in the stage 110*c* is driven by signals from the control unit 117 to turn the table in the θ-direction. Owing to the turning of the galvanomirror around the axis in the x-direction and the turning of the table in the θ-direction, the irradiation position of the ceramic substrate 111 can freely be set.

Incidentally, the table is able to turn not only in the θ-direction but also move in the x-y direction.

In such a manner, the stage 110*c* on which the ceramic substrate 111 is put and/or the galvanomirror 115 is moved, so that the laser beam 122 can be irradiated to any optional position of the ceramic substrate 111.

On the other hand, a camera 121 is also installed above the stage 110*c* and consequently, the position (x, y) of the ceramic substrate 111 is made recognizable. The camera 121 is connected to a memory unit 118 and accordingly the position (x, y) of the conductor layer 112*m* of the ceramic substrate 111 is recognized and laser beam 122 is irradiated to the position.

Further, an input unit 120 is connected to the memory unit 118 and comprises a keyboard (not illustrated) as a terminal and through the memory unit 118 and the keyboard and the like, given instructions are inputted.

Further, the laser trimming equipment is provided with a computation unit 119 and based on the data of such as the position of the ceramic substrate 111 recognized by the camera 121 and the thickness of the resistance heating element, computation for controlling the irradiation position, the irradiation speed, the intensity of the laser beam 122 is carried out and based on the computation results, instructions are transmitted to the motor 116, laser irradiation equipment 114 and the like from the control unit 117 to irradiate laser beam 122 while turning the galvanomirror 115 or moving or turning the stage 110*c* in order to perform trimming of the unnecessary portions of the conductor layer 112*m*.

Further, the laser trimming equipment comprises a resistivity measuring unit 123. The resistivity measuring unit 123 is provided with a plurality of tester pins 124. After dividing the resistance heating element into a plurality of sections, the tester pins 124 are brought into contact with the respective sections so as to measure the resistance value of the formed resistance heating element patterns. Then, based on the measured resistance value, laser is irradiated to the sections where the resistance value is low: to form gutters (reference to FIG. 12) approximately parallel to the electric current flow direction of the resistance heating element; or to form cuts approximately perpendicular to the electric current flow direction, so that the resistance value of the resistance heating element is adjusted and the resistance heating element with little unevenness of the resistance value can be obtained.

Next, a trimming method using such a laser trimming equipment will be described specifically.

In this case, a method for forming a resistance heating element by removing unnecessary portions of a strip-shaped or a ring shaped conductor layer which is formed on a ceramic substrate will mainly be described and a method for adjusting the resistance value of the resistance heating element will be described later.

Further, the steps other than the laser trimming step in the manufacturing methods of the ceramic heaters of the second and the third aspect of the present invention will be described in details later and here the steps will briefly described.

At first, a ceramic substrate is manufactured. In this process, firstly, a raw formed body comprising a ceramic powder and resin is produced. There are two production method of the raw formed body: one is a production method including the steps of producing a granule containing the ceramic powder and the resin and then loading a die or the like with the granule, and applying pressing pressure thereto; and the other is a production method including the steps of laminating and pressure-bonding green sheets. Proper methods will be selected depending on whether another conductor layer of electrostatic electrodes and the like will be formed in the inside or not and the like. After that, degreasing and firing of the raw formed body is carried out to manufacture the ceramic substrate.

After that, through holes are formed in the ceramic substrate to insert lifter pins and bottomed holes are formed to bury temperature measurement elements.

Next, to a wide area including the portions which is subjected to be the resistance heating elements on the ceramic substrate 111, a conductor containing paste layer with a shape as shown in FIG. 11 is formed by screen printing and the like and after that, a conductor containing paste layer is fired to form the conductor layer 112*m*.

The conductor layer may be formed by employing a plating method, a physical deposition method such as a sputtering. In the case of plating, a plating resist is formed and in the case of sputtering, selective etching is carried out, so that the conductor layer 112*m* can be formed in the given area.

Further, the conductor layer may be formed as described above in a manner some portions of the conductor layer are formed as resistance heating element patterns.

At the time of forming the conductor layer, the surface roughness Ra of the above-mentioned conductor layer according to JIS B 0601 is adjusted to 0.01 μm or more, preferably 0.1 to 10 μm. A method for forming a conductor layer (a resistance heating element) having such a roughened face will be described in details later and in the case of forming the conductor layer by screen printing, the surface roughness of the conductor layer can be adjusted by selecting the shape and the average particle diameter of a metal particle to be employed as a raw material for the resistance heating element. Further, at the time of forming the conductor layer by plating, for example, if conditions under which an acicular crystal is precipitated is selected to carry out the plating, the surface roughness can be adjusted. Further, buff grinding, sand blast treatment is also capable of adjusting the surface roughness.

Figure 14:
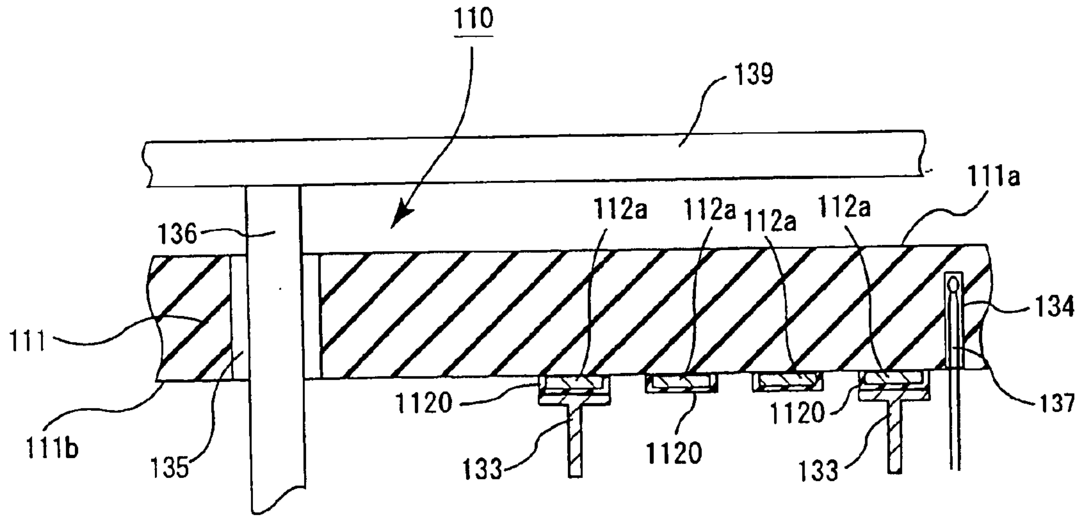
FIG. 14 is an enlarged figure of a portion of the ceramic heater shown in FIG. 13.

Next, as shown in FIG. 14, projections 110*b* for fixation formed in the stage 110*c* and to be brought into contact with side faces of the ceramic substrate 111 and projections (not illustrated) for fitting to be fit in through holes to insert lifter pins into are used to fix the ceramic substrate 111 on the stage 110*c*.

Further, data of the resistance heating element patterns is previously inputted through the input unit 120 and housed in the memory unit 118. That is, the data of the resistance heating element patterns to be formed by performing trimming is stored. The data of the resistance heating element patterns is the data to be used for forming the resistance heating element patterns by performing trimming the conductor layer printed like a plane (so-called spread state or ring shaped).

Next, the fixed ceramic substrate 111 is photographed by the camera 121, so that the formation position of the conductor layer 112*m* is stored in the memory unit 118.

Based on the data of the position of the conductor layer, computation is carried out in the computation unit 119 and the results are stored in the memory unit 118 as the control data.

After that, based on the computation results, the control signals are generated from the control unit 117 and while the motor 116 of the galvanomirror 115 and/or the motor of the stage 110*c* being driven, a laser beam is irradiated to trim unnecessary portions of the conductor layer 112*m* with the surface roughness of 0.01 μm or more and the resistance heating element 112 is formed.

At the time of removing the unnecessary portions of the conductor layer and the like in such a manner, it is important that even though the portions of the conductor layer and the like which should be trimmed by the laser beam irradiation are trimmed, the laser beam does not affect the ceramic substrate existing thereunder.

Accordingly, the laser beam is required to be selected so as to be well absorbed in the metal particle and the like constituting the conductor layer and the like, on the other hand, be hardly absorbed in the ceramic substrate. Such laser type includes, YAG laser, carbonic acid gas laser, excimer (KrF) laser, UV (ultraviolet) laser and the like.

Among them, YAG laser and excimer (KrF) laser are the most optimum.

As YAG laser, SL 432H, SL 436G, SL 432GT, SL 411B and the like manufactured by NEC can be employed.

As laser, pulsed beam with a frequency of 2 kHz or less is preferable and pulsed beam with a frequency of 1 kHz or less is more preferable. It is because high energy can be irradiated to the resistance heating element within an extremely short time and the damage on the ceramic substrate can be suppressed to slight. Further, the energy of the first pulse does not become high and gutters with a width as designed can be formed. If the frequency of the pulses of the laser beam exceeds 2 KHz, the energy of the first pulse becomes too high and the gutters with a wider width than designed are formed and consequently, the resistance heating element cannot be formed as designed.

Further, the processing speed is preferably 100 mm/second or less. It is because if it exceeds 100 mm/second, gutters cannot be formed unless the frequency is increased. As described above, in order to limit the frequency up to 2 kHz, the speed is preferably 100 mm/second or less.

The output of the laser is preferably 0.3 W or more. It is because if it is less than 0.3 W, the conductor layer to be removed for forming the patterns of the resistance heating element may not completely trimmed in some cases. Especially, in the case the resistance heating element is of a sintered body of a metal particle, trimming with the output of 0.3 W or more can be carried out to the depth reaching the ceramic substrate and makes complete removal of the conductor layer possible.

Although trimming may be carried out for the conductor containing paste layer, trimming is preferable to be performed after formation of the conductor layer, as described above, after printing a conductor containing paste and then firing the printed paste. It is because: the resistance value is fluctuated by firing the paste; and the paste may possibly be peeled in some cases attributed to irradiation of the laser beam.

The manufacturing method of the second and the third aspect of the present inventions is a method of forming a ring shaped (so-called spread state) paste by using a conductor containing paste and performing trimming the formed paste so as to pattern it. Hence, heating element patterns with an even thickness can be obtained. If the printing of the heating element patterns is conducted from the beginning, the thickness becomes uneven depending on the printing direction so that it becomes difficult to form the resistance heating element with an even thickness.

Figure 12:
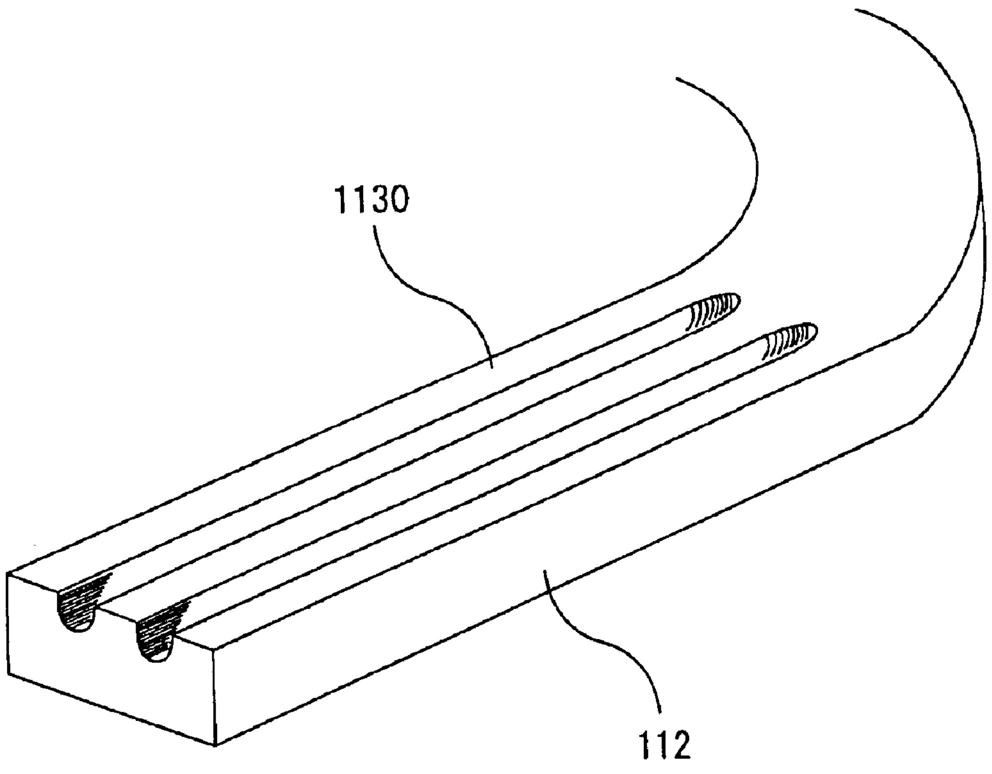
FIG. 12 is an oblique view schematically showing gutters formed when a resistance heating element is subjected to trimming treatment.

In the above-mentioned description, the method for forming the resistance heating element by laser beam irradiation was described, but in the case of adjusting the resistance value of the resistance heating element by performing trimming after formation of the resistance heating element in the given patterns on the ceramic substrate, as shown in FIG. 12, gutters 1130 are formed in approximately parallel to the direction of the electric current flow in the resistance heating element 112 and thereby, the resistance value of the resistance heating element can be adjusted. Although the resistance may be adjusted by forming cuts approximately perpendicularly to the direction of the electric current flow in the resistance heating element, the method for forming gutters is preferable since it is less probable to cause disconnection of the heating element.

In this case, as described above, the resistance heating element is divided into a large number of the portions and using tester pins 124, the resistance values of the respectively divided portions are measured and their resistance values are adjusted by performing trimming.

The patterns of the resistance heating element formed by such laser trimming is not particularly limited and, for example, the following resistance heating element patterns can be exemplified. Incidentally, hereinafter, the ceramic heater comprising the resistance heating element patterns will be shown.

Figure 13:
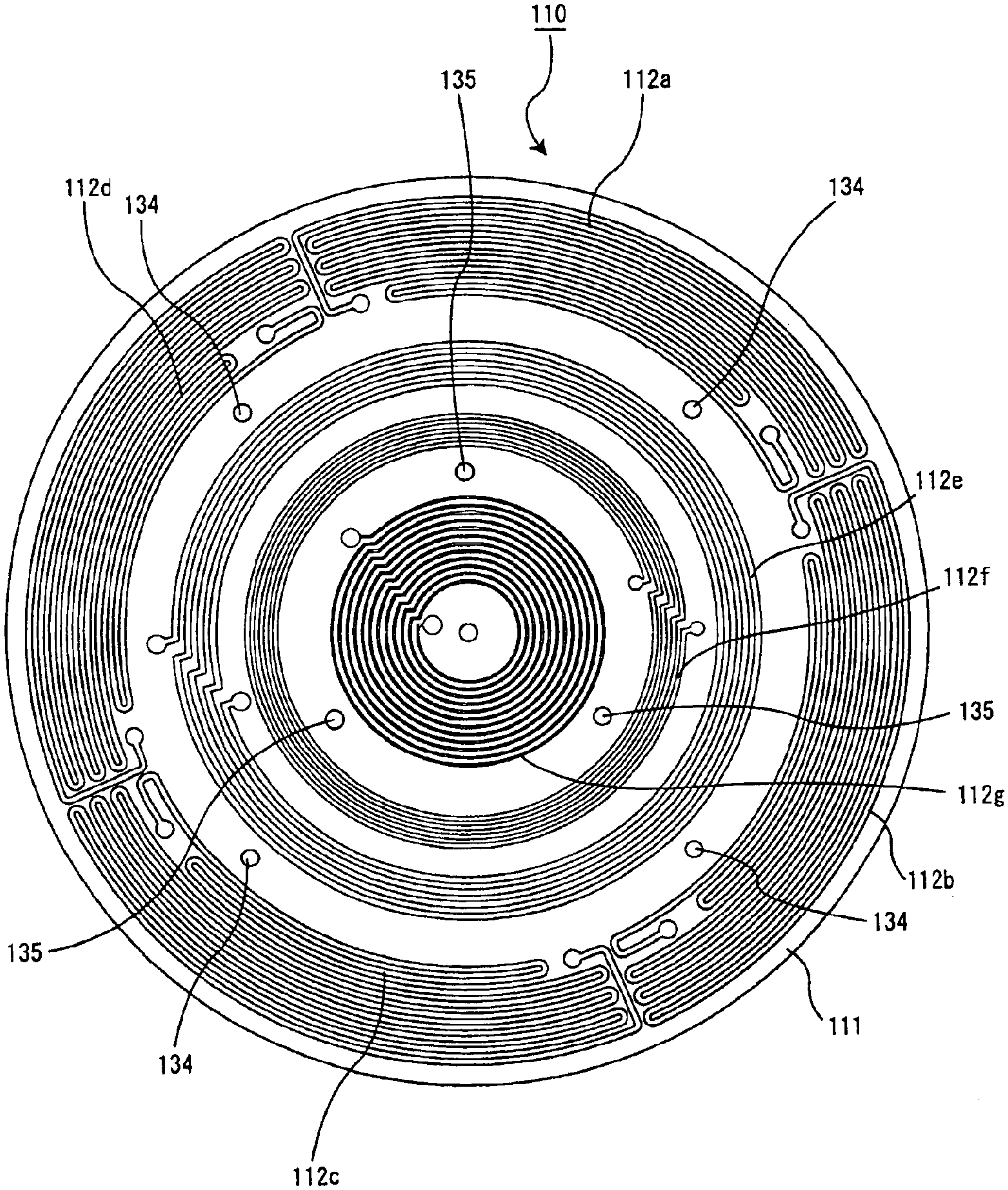
FIG. 13 is a bottom plane view schematically showing one embodiment of the ceramic heaters according to the second and the third aspect of the present invention.

FIG. 13 is a bottom face view schematically showing the ceramic heater manufactured by the ceramic heater manufacturing method of the second aspect of the present invention and FIG. 14 is a partially enlarged cross-sectional view of the ceramic heater. Incidentally, gutters formed by performing trimming are not shown in the resistance heating element patterns 112*a* to 112*g* shown in FIG. 14.

The ceramic heater 110 has the resistance heating element 112 (112*a* to 112*g*) on the bottom face 111*b*, the reverse side of the heating face 111*a* of the ceramic substrate 111 formed into a disk-like shape.

The resistance heating element 112 is formed into patterns composed of basically arcs so repeated as to draw a part of concentric circles in order to carry out heating in a manner that the entire area of the heating face 111*a* has an even temperature.

That is, the resistance heating element patterns 112*a* to 112*d* which are closest to outer circumference are formed by repeating patterns in an arc-like shape formed by dividing respective concentric circles into four and the end parts of the neighboring arcs are connected to each other through winding lines to form series of circuits. Four circuits comprising such resistance heating element patterns 112*a* to 112*d* are arranged near to one another so as to be surrounded by the outer circumference to form ring-shaped patterns as a whole.

Further, the end parts of the circuits composed of the resistance heating element patterns 112*a* to 112*d* are formed in the inside of the ring-shaped patterns in order to prevent formation of cooling spots and subsequently, the end parts of the circuits in the outer side are extended toward the inside.

Inside of the resistance heating element patterns 112*a* to 112*d* formed in the periphery, the resistance heating element patterns 112*e*, 112*f*, and 112*g* respectively composed of concentrically patterned circuits of which slight portions are cut are formed and in the resistance heating element patterns 112*e*, 112*f*, and 112*g*, end parts of the neighboring concentric circles are connected to each other successively through the resistance heating element patterns of straight lines to form series of circuits.

Further, in the spaces between respectively neighboring resistance heating element patterns 112*a* to 112*d*, 112*e*, 112*f*, and 112*g*, belt-like (ring-shaped) no-resistance heating element formed area are formed and also in the center part, no-resistance heating element formed area is formed.

Accordingly, as a whole view, the ring-shaped resistance heating element formed area and no-resistance heating element formed area are alternately formed from the outer side to the inner side and in consideration of the size (the diameter) and the thickness of the ceramic substrate, these areas are properly designed, so that it is made possible to make the temperature of the heating face even.

After trimming treatment, the resistance heating element patterns 112*a* to 112*g* are covered with a metal covering layer 1120 as illustrated in FIG. 14 in order to prevent corrosion and external terminals 133 are connected to their end parts through the solder layer 1120.

In the ceramic substrate 111, three through holes 135 are formed at the positions in the no-resistance heating element formed area and other than the case that an object to be heated, such as a silicon wafer 139, is heated while being put directly on the heating face 111*a* of the ceramic substrate 111, the object to be heated can be heated while being kept at a given distance from the ceramic substrate 111 by inserting lifter pins 136 into these through holes 135 and holding the object to be heated such as a silicon wafer 139 by the lifter pins 136 as illustrate in FIG. 14.

Further, it is also made possible to receive an object to be heated such as the silicon wafer 139 from a transporting equipment, put the object on the ceramic substrate 111, and to heat the object to be heated while being supported. Concave portions are formed in the heating face 111*a* of the ceramic substrate 111 and supporting pins are arranged in the concave portions so as to be slightly projected out of the heating face 111*a* and the silicon wafer 139 can be heated while being kept at 5 to 5,000 μm from the heating face of the silicon wafer 139 by supporting the silicon wafer 139 by the supporting pins.

In the no-resistance heating element formed area on the bottom face 111*b* of the ceramic substrate 111, bottomed holes 134 are formed and in the bottomed holes 134, temperature measurement elements 137 such as thermocouples are inserted and it is made possible to measure the temperature in the vicinity of the heating face 111*a* of the ceramic substrate 111.

In the ceramic heater having the above-mentioned resistance heating element patterns, the resistance heating element is composed of: the patterns forming series of circuits by combining arcs and winding lines repeatedly formed as if drawing some portions of concentric circles on the disk-like ceramic substrate (hereinafter, referred also to as arc-repeated patterns); and the patterns composed of series of circuits formed by straightly connecting end parts of the neighboring concentric circles of which small portions are cut (hereinafter referred also to as concentric circles-like patterns), thus, most portions of such resistance heating element patterns can be defined with distance r from the center of the ceramic substrate and the rotation angle ($\theta_1$–$\theta_2$).

Accordingly, at the time of performing laser trimming, if the ceramic substrate is mainly rotated around its center, the resistance value of the resistance heating element can relatively easily be adjusted and in the ceramic heater comprising the resistance heating element whose resistance value is adjusted by such a method, the temperature of the heating face becomes even and an object to be heated such as a semiconductor wafer can be heated at an even temperature.

Further, by the manufacturing method of the third aspect of the present invention, that is, by performing trimming of the conductor layer of the ceramic heater formed in ring shape, the ceramic heater having the resistance heating element in patterns shown in FIG. 13 can be manufactured. That is the same in the case of a ceramic heater having the resistance heating element with the shape described below.

The ceramic heater to be manufactured by the manufacturing method of the second and the third aspect of the present inventions is not limited to those having the resistance heating element in patterns shown in FIG. 13 and may have: the above-mentioned arc-repeated patterns; concentric circles-like patterns and repeated pattern of winding lines, alone or in combination of these patterns arbitrarily.

Figure 15:
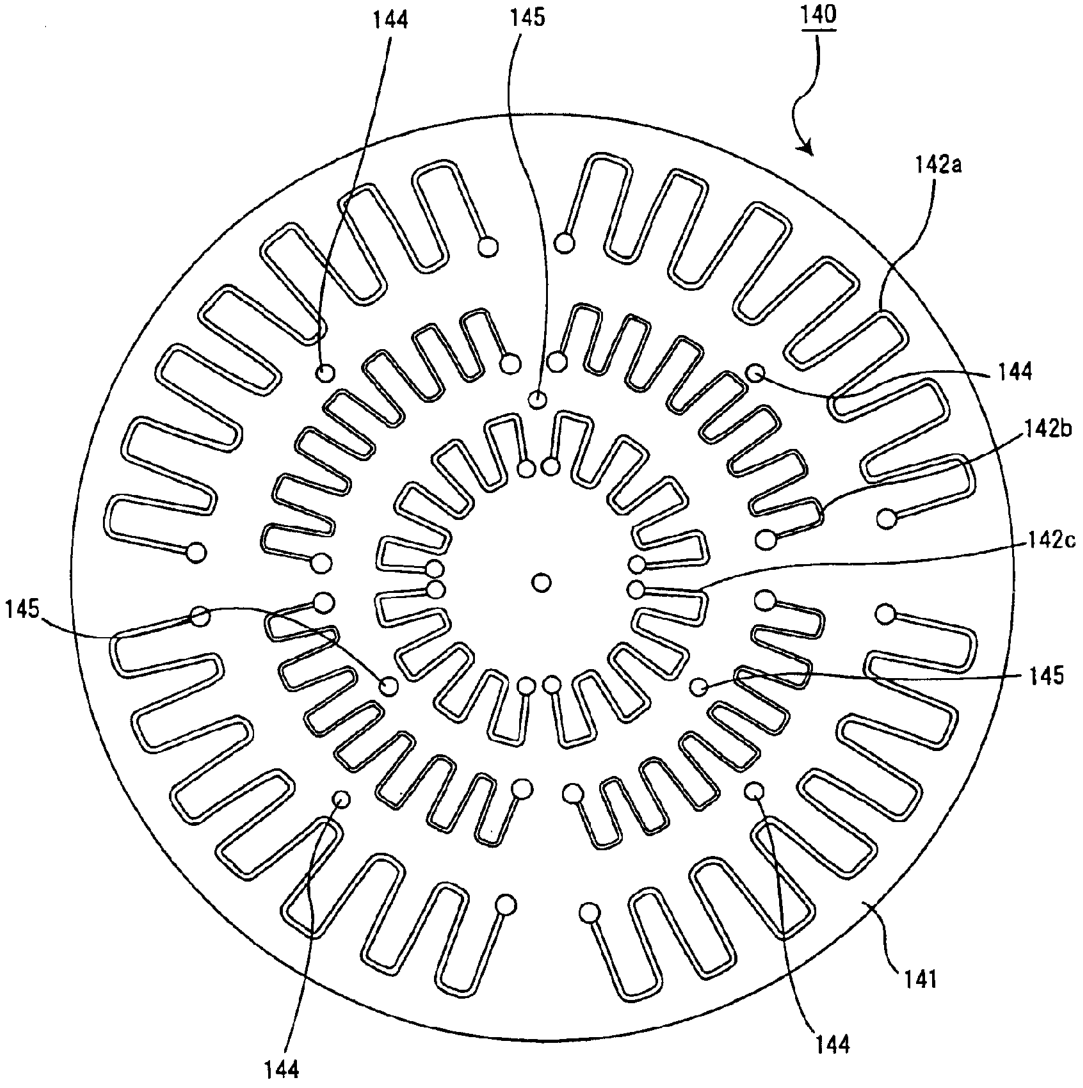
FIG. 15 is a plane view schematically showing other ceramic heaters manufactured by the second and the third manufacturing methods of the present invention.

FIG. 15 is a plane view schematically showing another embodiment of the ceramic heater to be manufactured by the manufacturing methods of the second and the third aspect of the present inventions. In the ceramic heater, as shown in FIG. 15, resistance heating element patterns 142*a*, 142*b*, 142*c* mainly composed of winding lines and respectively formed in a ring shapes are arranged in a radiating manner as a whole so as to sandwich the circular no-resistance heating element formed area and the center no-resistance heating element formed area.

Incidentally, as illustrated in FIGS. 13, 15, the resistance heating element formed on the surface of the ceramic substrate is preferable to be divided into two or more circuits. Owing to the division of the circuits, the calorific value can be controlled by electric power to be applied to the respective circuits and thus, the temperature of the heating face of the silicon wafer can be controlled.

At the time of forming such resistance heating element patterns, in the case the patterns have wide gaps between neighboring resistance heating element patterns as shown in FIG. 15, the resistance heating element can easily be formed by screen printing. Whereas, in the case the patterns have the narrow gaps and complicated (dense) shape as shown in FIG. 13, by a method comprising steps of at first forming a ring-shaped conductor layer composed of wide strip-shaped lines and then performing trimming the parts (unnecessary parts) where resistance heating element is not supposed to exist by laser beam, the resistance heating element can be relatively easily formed and therefore advantageous.

In the case of forming the resistance heating element on the surface of the ceramic substrate, the thickness of the resistance heating element is preferably 1 to 30 μm and more preferably 1 to 10 μm. The width of the resistance heating element is preferably 0.1 to 20 mm and more preferably 0.1 to 5 mm.

The resistance value of the resistance heating element can be changed by the width and the thickness, and the above-mentioned ranges are most practical.

The resistance heating element may have a cross-sectional shape with either a rectangular or an elliptical shape, however it is preferably flat. It is because if the shape is flat, heat irradiation toward the heating face easily takes place and uneven temperature distribution in the heating face is hardly caused.

The aspect ratio of the cross-section (width of the resistance heating element/thickness of the resistance heating element) is preferably 10 to 5000.

It is because the resistance value of the resistance heating element can be high and the evenness of the temperature in the heating face can be assured as well by controlling the ratio within the range.

In the case of making the thickness of the resistance heating element constant, if the aspect ratio is smaller than the above-mentioned range, the transmission quantity of the heat in the heating face direction in the ceramic substrate is lowered and the temperature distribution similar to the patterns of the resistance heating element is caused in the heating face and on the contrary, the aspect ratio is too high, the portions immediately above the center of the resistance heating element becomes at high temperature and consequently, temperature distribution similar to the patterns of the resistance heating element is caused in the heating face. Accordingly, taking the temperature distribution into consideration, the aspect ratio of the cross-section is preferably 10 to 5000.

Regarding the dispersion of the resistance value of the resistance heating element, the dispersion of the resistance value in relation to the average resistance value is preferably 5% or less and more preferably 1%. The resistance heating element of the present invention is divided into a plurality of circuits, and keeping the resistance value dispersion small as described above makes it possible to decrease the number of the division of the resistance heating element and makes it easy to control the temperature. Further, the temperature of the heating face during the transition period of temperature rise can become even.

Generally, such a resistance heating element is formed by applying to the ceramic substrate a conductor containing paste containing a metal particle and a conductive ceramic particle for ensuring the conductivity and firing the paste. The conductor containing paste is not particularly limited, however those containing resin, a solvent, and a thickening agent other than the above-mentioned metal particle or the conductive ceramic are preferable.

As the above-mentioned metal particle, for example, a noble metal (gold, silver, platinum, palladium), lead, tungsten, molybdenum, nickel and the like are preferable. They may be used alone or in combination of two or more of them. Because these metals are relatively hard to be oxidized and have sufficient resistance value enough to generate heat.

As the above-mentioned conductive ceramic, for example, carbide of tungsten and molybdenum can be exemplified. They may be used alone or in combination of two or more of them.

The particle diameter of the metal particle or the conductive ceramic particle is preferably 1 to 100 μm. It is because if it is too small, less than 1 μm, the surface roughness Ra of the resistance heating element easily becomes less than 0.01 μm and at the time of performing trimming by laser beam irradiation, laser beam is easy to be reflected and gutters cannot be formed as designed and on the other hand, if the particle diameter of the metal particle and the like exceeds 100 μm, sintering becomes hard to be carried out to result in a high resistance value.

The shape of the above-mentioned metal particle may be spherical or scaly, however it is more preferably spherical. It is because the surface roughness of the resistance heating element can be more easily roughened. Further, even in the case of scaly shape, if the aspect ratio (the width or length/the thickness) is not so high, the surface roughness can be made high because the particle is disposed easily perpendicularly or slantingly in relation to the formation face of the resistance heating element.

In the case of using such a metal particle, a mixture of the above-mentioned spherical particle and the above-mentioned scaly particle can be used.

In the case the above-mentioned metal particle is a spherical one or a mixture of the spherical one and the scaly one, the metal oxide can easily be held among the metal particle and the adhesion strength between the resistance heating element and the nitride ceramic and the like can be assured and the resistance value can be high and therefore they are advantageous.

Further, in the case of an ascicular particle, if it has an aspect ratio (the length in relation to the diameter) not so high, the particle is disposed easily perpendicularly or slantingly in relation to the formed face of the resistance heating element, so that the surface roughness can be high.

As the resin to be used for the conductor containing paste, for example, epoxy resin, phenol resin and the like can be exemplified. Also, as the solvent, for example, isopropyl alcohol and the like can be exemplified. As the thickening agent, cellulose and the like can be exemplified.

As the conductor containing paste, one containing a metal particle added with a metal oxide is used and it is preferable to sinter the metal particle and the metal oxide after application to the ceramic substrate. Because sintering of the metal oxide together with the metal particle makes the adhesion of the metal particle and the nitride ceramic of the ceramic substrate further close.

The reason for the improvement of the adhesion to the nitride ceramic and the like owing to the metal oxide addition is not made clear, however it can be supposed that the metal particle surface and the surface of the nitride ceramic and the like are slightly oxidized and covered with an oxide film and the respective oxide films are unitedly sintered through the metal oxide to cause close adhesion between the metal particle and the nitride ceramic. Further, in the case the ceramic of the ceramic substrate is an oxide, since the surface is naturally the oxide, a conductor layer with a high adhesion strength can be formed.

As the above-mentioned metal oxide, for example, at least one oxide selected from a group consisting of lead oxide, zinc oxide, silica, boron oxide ($B_2O_3$), alumina, yttria, and titania is preferable to be used.

It is because these oxides can improve the adhesion strength to the metal particle and the nitride ceramic without increasing the resistance value of the resistance heating element 112.

The ratio of the above-mentioned lead oxide, zinc oxide, silica, boron oxide ($B_2O_3$), alumina, yttria, and titania is respectively 1 to 10 for lead oxide, 1 to 30 for silica, 5 to 50 for boron oxide, 20 to 70 for zinc oxide, 1 to 10 for alumina, 1 to 50 for yttria, 1 to 50 for titania by weight ratio in the case the total amount of the metal oxides is set to be 100 parts by weight and they are preferable to be adjusted so as to keep their total not exceeding 100 parts by weight.

Adjustment of the quantities of these oxides in these ranges is efficient to improve the adhesion property especially to the nitride ceramic.

The addition amount of the above-mentioned metal oxides in relation to the metal particle is preferably not less than 0.1% by weight and less than 10% by weight. Further, the area resistivity in the case the resistance heating element 12 is formed using such a conductor containing paste is preferably 1 to 45 mΩ/□.

If the area resistivity exceeds 45 mΩ/□, the calorific value for the applied voltage becomes too high and in the case of a ceramic substrate 11 bearing the resistance heating element 12 on the surface, the calorific value becomes difficult to be controlled. If the addition amount of the metal oxides is 10% by weight or more, the area resistivity exceeds 50 mΩ/□ and the calorific value becomes too high to control the temperature and consequently, the evenness of the temperature distribution deteriorates.

Further, if necessary, the area resistivity can be controlled to be 50 mΩ/□ to 10 Ω/□. If the area resistivity is increased, the pattern width can be wide and there occurs no disconnection problem.

In the case the resistance heating element is formed on the surface of the ceramic substrate, a metal covering layer is preferable to be formed on the surface part of the resistance heating element. It is because the resistance value change owing to oxidation of the metal sintered body in the inside can be prevented. The thickness of the metal covering layer to be formed is preferably 0.1 to 10 μm. Such a metal covering layer is to be formed after the above-mentioned trimming treatment is performed.

The metal to be used for the metal covering layer formation is not particularly limited if it is a non-oxidizable metal and practically, for example, gold, silver, palladium, platinum, nickel and the like can be exemplified. They can be used alone or in combination of two or more of them. Among them, nickel is preferable.

It is because, for the resistance heating element, terminals for the connection to an electric power are required to be attached to the resistance heating element through a solder because nickel can prevent thermal diffusion of the solder. As the connection terminals, those made of Kovar can be exemplified.

The ceramic substrate to be used for manufacturing methods of the second and the third aspect of the present inventions is preferably a disk plate and those with a diameter exceeding 190 mm are preferable. Because such a substrate with a larger diameter has a wider temperature dispersion on the heating surface.

The thickness of the above-mentioned ceramic substrate is preferably 25 mm or less. Because, if the thickness of the above-mentioned ceramic substrate exceeds 25 mm, the temperature-following property deteriorates.

The thickness is more preferably not exceeding 1.5 mm and 5 mm or less. Because if the thickness is thicker than 5 mm, the heat transmission becomes difficult and the heating efficiency tends to deteriorate, whereas if it is 1.5 mm or less, the heat transmitted in the ceramic substrate is not sufficiently diffused, so that the temperature distribution possibly becomes uneven in the heating face and the strength of the ceramic substrate is possibly deteriorated and broken.

In the ceramic heater 110 manufactured by the manufacturing methods of the second and the third aspect of the present inventions, a ceramic is used as the material of the substrate, however the material of the ceramic is not particularly limited and, for example, a nitride ceramic, a carbide ceramic, and an oxide ceramic can be exemplified.

As the material for the ceramic substrate 111, among them preferable are the nitride ceramic and the carbide ceramic. Because they are excellent in the thermal conduction.

The above-mentioned nitride ceramic includes, for example, aluminum nitride, silicon nitride, boron nitride, titanium nitride, and the like. Also, the above-mentioned carbide ceramic includes silicon carbide, titanium carbide, boron carbide and the like. Further, as the above-mentioned oxide ceramic, the example thereof include alumina, cordierite, mullite, silica, beryllia and the like. They may be used alone or in combination of two or more of them.

Among them, the most preferable is aluminum nitride. Because it has the highest thermal conduction of 180 W/m·K.

However, a material which hardly absorbs laser beam is preferable for the ceramic substrate 111 and for example, in the case of the aluminum nitride substrate, those having a carbon content of 5000 ppm or less are preferable.

Further, the surface roughness is preferably made to have Ra of 20 μm or less according to JIS B 0601 by grinding the surface. Because in the case the surface roughness is high, laser beam is absorbed.

Further, if necessary, a heat resistant ceramic layer may be formed between the resistance heating element and the ceramic substrate. For example, in the case of a non-oxide type ceramic, an oxide ceramic may be formed on the surface.

The method for forming the resistance heating element on the surface of the ceramic substrate, using the above-mentioned method, includes: a method for forming the resistance heating element patterns by applying a conductor containing paste in a plane shape (a ring like shape) to a given area of the ceramic substrate and then performing laser trimming to form a resistance heating element; and a method for forming a resistance heating element in given patterns by baking a conductor containing paste and then performing laser trimming to form a resistance heating element. Among these method, a method involving steps of baking the conductor containing paste on and then forming the resistance heating element patterns is preferable since peeling of the conductor containing paste layer and the like is not caused by laser beam irradiation.

Incidentally, the sintering of metal is sufficient if the metal particles are melted and adhered to each other and the metal particles and the ceramic are melted and adhered to each other. Further, the resistance heating element patterns may be formed by forming the conductor layer in given areas by employing a method of such as a plating and a sputtering and then performing laser trimming.

Next, the ceramic heater manufacturing methods of the second and the third aspect of the present inventions other than the above-mentioned laser trimming step will be described with reference to FIG. 16.

Figure 16:
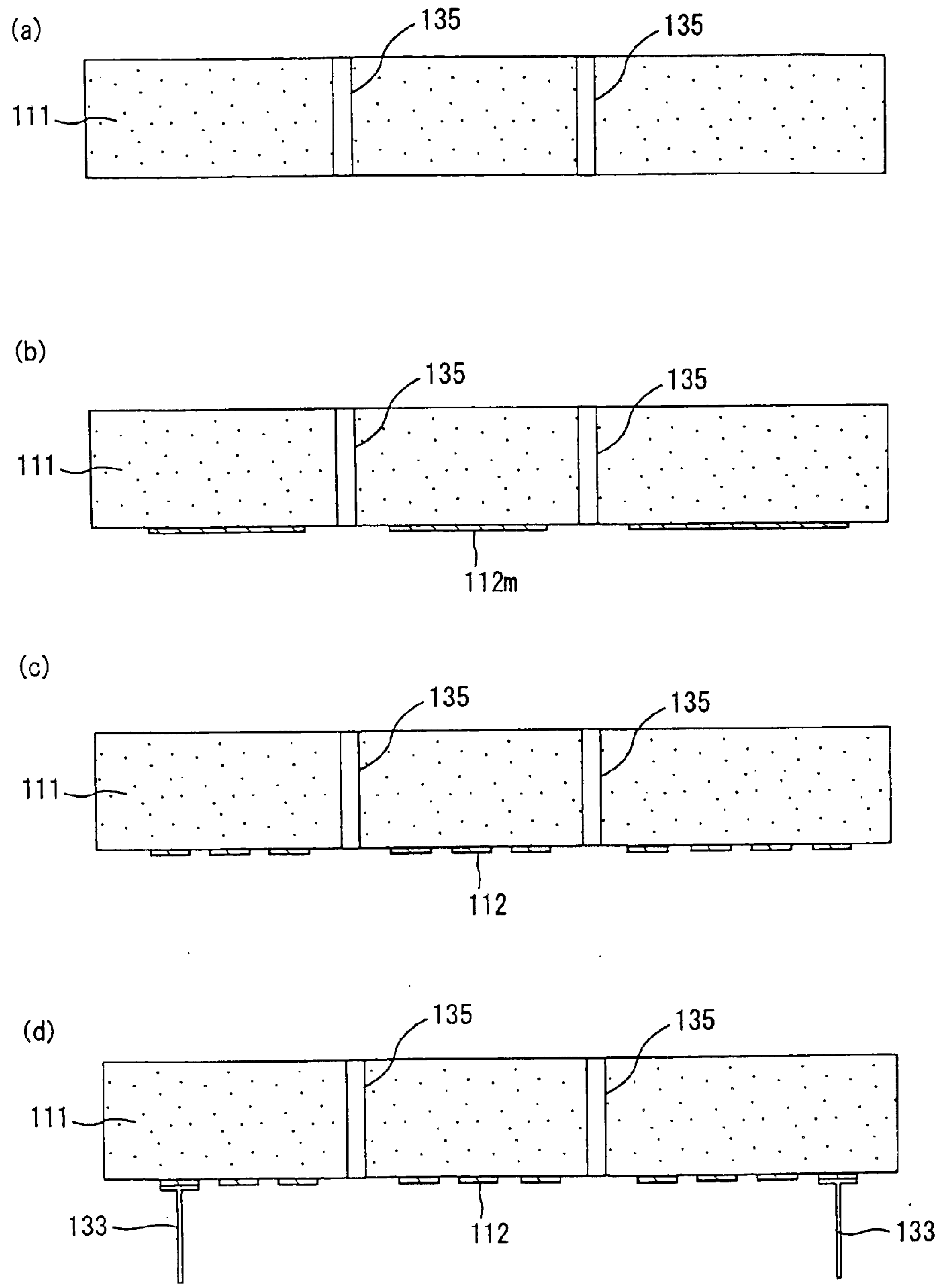
FIG. 16(*a*) to (*d*) is a cross-sectional view schematically showing a portion of manufacturing process of the ceramic heater of the second and the third aspect of the present inventions.

FIGS. 16(*a*) to 16(*d*) shows cross-sectional view schematically illustrating some portion of the ceramic heater manufacturing methods of the second and the third aspect of the present inventions including the laser treatment.

(1) Ceramic Substrate Manufacturing Step

After a slurry is produced by mixing a sintering aid such as yttria ($Y_2O_3$), a compound containing Na and Ca, and a binder based on the necessity with a ceramic powder of such as aluminum nitride and the slurry is granulated by spray drying method and the like and the granule is molded by putting it in a die and pressurizing it to be like a plate and the like and obtain a raw formed body (green).

The raw formed body may be produced by layering green sheets formed by a doctor blade method and the like.

Next, if necessary, parts to be through holes 135 into which insert lifter pins 136 are inserted to transport an object to be heated such as a silicon wafer 139 and parts to be bottomed holes in which temperature measurement elements such as thermocouples are buried are formed.

Next, the raw formed body is heated and fired to be sintered so as to produce a plate-like body of a ceramic. After that, a ceramic substrate 111 is manufactured by processing the plate-like body into a given shape (reference to FIG. 16(*a*)), however the plate-like body may previously be formed into a shape so as to use the plate-like body as it is. Also, the formed body is heated and fired while it is pressurized from upper and lower sides to make it possible to manufacture a pore-free ceramic substrate 111. Heating and firing may be carried out at a sintering temperature or more and in the case of a nitride ceramic, it is 1000 to 2500° C.

Incidentally, in general, the through holes 135 and the bottomed holes (not illustrated) to insert the temperature measurement elements are formed after firing. The through holes 135 and the like can be formed by blast treatment such as a sand blast using SiC particle after surface grinding.

(2) Step of Printing Conductor Containing Paste to Ceramic Substrate

A conductor containing paste is generally a fluid with a high viscosity containing a metal particle, resin and a solvent. The viscosity of the conductor containing paste is preferably 70 to 90 Pa·s. Since if the viscosity of the conductor containing paste is less than 70 Pa·s, the viscosity is too low to produce a paste containing a metal with an even concentration and it becomes difficult to form a conductor layer with an even thickness, whereas if it exceeds 90 Pa·s, the viscosity of the paste is too high to do the application work easily and also it becomes impossible to form a conductor layer with an even thickness. In order to form a conductor layer having a roughened face, the viscosity of the conductor containing paste is preferable to be high. Since the metal with a scaly or acicular shape is easy to become perpendicular or slantingly to the formation face of the resistance heating element.

The conductor containing paste layer 112*m* is formed by screen printing by printing the conductor containing paste in a strip shaped or a ring shaped to the entire area where the resistance heating element is to be formed (FIG. 16(*b*)).

Since the resistance heating element patterns are required to heat the whole body of the ceramic substrate at an even temperature, the patterns are preferable to be composed of arcs or concentric circles which are formed repeatedly as to draw some portions of concentric circles as shown in FIGS. 13.

Incidentally, other than the above-mentioned method, the conductor layer can be formed by plating and in this case, by carrying out the plating so as to form an acicular plating layer, the resistance heating element with a roughened surface can be formed. In such a case, it is preferable to form the acicular plating layer by forming a thin film by an electroless plating and the like and then carrying out electroplating on the thin film.

Further, after a thick film plating layer is formed, etching is carried out to form the roughened surface.

(3) Conductor Containing Paste Firing Step

The conductor containing paste layer printed at the bottom face of the ceramic substrate 111 is heated and fired to remove the resin and the solvent and at the same time to sinter the metal particle and bake the particle in the bottom face of the ceramic substrate 111 to form the conductor layer with a given width (reference to FIG. 14) and after that, trimming treatment by laser as described above is performed to form resistance heating element (reference to FIG. 16).

In this case, the surface roughness of the conductor layer surface can be adjusted by changing the heating and firing conditions. The temperature of heating and firing is preferably 500 to 1000° C. and by firing at a relatively low temperature, the metal is prevented from melting to be flattened and the surface roughness Ra of the conductor layer can be adjusted to be 0.01 μm or more. Nevertheless, if the temperature is too low, sintering of metal particles is not promoted and the resistance value of the resistance heating element becomes too high, so that depending on the metal to be used, a proper firing temperature has to be selected.

After the conductor containing paste layer of the resistance heating element patterns is formed by the above-mentioned screen printing, plating, and sputtering methods, the layer is fired to be the resistance heating element 112 and the resistance value of the resistance heating element can be adjusted by laser trimming.

(4) Metal Covering Layer Formation

As shown in FIG. 14, a metal covering layer 1120 is preferable to be formed on the surface of the resistance heating elements 112. The metal covering layer 1120 may be formed by electroplating, electroless plating, sputtering and the like and in consideration of mass productivity, the electroless plating is the most optimum.

(5) Attachment of Terminals and the Like

Terminals (external terminals 133) for connection to an electric power source are attached to the terminal parts of the patterns of the resistance heating element 112 by a solder (FIG. 16(*d*)). Further, thermocouples are embedded in the bottomed holes 134 (not illustrated) and sealed with heat resistant resin of such as polyimide to complete a ceramic heater.

Incidentally, the ceramic heater manufactured by the manufacturing methods of the second and the third aspect of the present inventions can be used as an electrostatic chuck by forming electrostatic electrodes in the inside of the ceramic substrate and also can be used as a wafer prober by forming a chuck top conductor layer on the surface and guard electrodes and ground electrodes in the inside.

Next, a ceramic heater of the fourth aspect of the present invention will be described.

The ceramic heater of the fourth aspect of the present invention is a ceramic heater comprising:

a ceramic substrate; and a resistance heating element formed on a surface of said ceramic substrate, wherein a gutter or a cut is formed at a part of said resistance heating element.

In the ceramic heater of the fourth aspect of the present invention, as gutters or cuts formed in the part of the resistance heating element, for example, similar ones to those described in the manufacturing methods of the ceramic heater of the second aspect of the present invention can be listed.

Also in the ceramic heater of the fourth aspect of the present invention, the surface roughness Ra of the surface of the above-mentioned resistance heating element according to JIS B 0601 is 0.01 μm or more and its preferable range is as described above.

Also, in the ceramic heater of the fourth aspect of the present invention, the above-mentioned resistance heating element is preferable to be covered with an insulating layer and, as the above-mentioned insulating layer similar ones to the insulating covering of the ceramic heater of the first aspect of the present invention can be listed.

BEST MODE FOR CARRYING OUT THE INVENTION

EXAMPLE 1

After a slurry was produced by mixing and kneading 100 parts by weight of an aluminum nitride powder (the average particle diameter of 1.1 μm), 4 parts by weight of yttrium oxide (the average particle diameter of 0.4 μm), 12 parts by weight of an acrylic resin binder and alcohol, the slurry was sprayed by a spray drying method to produce a granular powder.

Next, the granular powder was put in a die and molded into a flat shape to obtain a raw formed body. The raw formed body was hot pressed at a temperature of 1800° C. and a pressure of 200 $kg/cm^2$ to obtain a plate-like sintered body of aluminum nitride with a thickness of 3 mm. Next, the sintered body was cut to obtain a ceramic substrate 11 (reference to FIG. 11) for a ceramic heater.

Next, the ceramic substrate was bored by drilling-processing to form through holes 15 to insert lifter pins 16 for a semiconductor wafer into and bottomed holes 14 to embed thermocouples therein.

On the ceramic substrate 11 for which the above-mentioned processing was finished, for example, a conductor containing paste was printed by a screen printing method so as to form patterned strip-shaped resistance heating element 12 as shown in FIG. 1. The conductor containing paste employed in this case was Solvest PS 603D (trade name) manufactured by Tokuriki Chemical Research Co., Ltd., which was a so-called silver paste containing 7.5% by weight of metal oxides consisting of lead oxide, zinc oxide, silica, boron oxide, and alumina (5/55/10/25/10 by weight ratio in this order) in relation to the silver. The silver particle had an average particle diameter of 4.5 μm and mainly had a scaly shape.

The ceramic substrate 11 bearing the conductor containing paste was heated and fired at 780° C. to sinter silver in the conductor containing paste and at the same time bake silver in the ceramic substrate. In this case, the resistance heating element 12 of the silver sintered body had a thickness of about 10 μm, a width of about 2.4 mm, and the area resistivity of 5 mΩ/□.

After that, an insulating covering 17 of an oxide type glass material was formed on the surface of the resistance heating element 12.

At first, a paste-like mixture was produced by mixing 87 parts by weight of glass powder having a composition comprising PbO: 30% by weight, $SiO_2$: 50% by weight, $B_2O_3$: 15% by weight, $Al_2O_3$: 3% by weight, and $Cr_2O_3$: 2% by weight with 3 parts by weight of a vehicle and 10 parts by weight of a solvent.

Next, using the paste-like mixture, screen printing was carried out so as to cover the surface of the resistance heating element 12 to form a layer of the paste-like mixture. After that, the paste-like mixture was dried and fixed at 120° C. and fired at 680° C. for 10 minutes in air to form an insulating covering 17 by being melted and adhered to the surface of the resistance heating element 12 and the ceramic substrate 11. After that, the surface of the insulating covering was subjected to sand blast treatment using a SiC powder with an average particle diameter of 10 μm to adjust the surface roughness Ra of the insulating covering. At that time, the thickness of the insulating covering 17 was 10 μm. However, the insulating covering 17 was not formed in the connecting portions of the external terminals 133 in both ends of circuits comprising the resistance heating element 12. Accordingly, the covering state in the vicinity of the external terminals was different from the ceramic heater 10 shown in FIG. 2.

Incidentally, at the time of fusion bonding by heating, a method involving preliminary molding in a shape to be fitted with the shape of the insulating covering 17 and then putting the preliminarily formed body on the resistance heating element 12 and heating the formed body, may be employed as well.

Next, a silver-containing lead paste (made by Tanaka Kikinzoku Kogyo K. K.) was printed in the parts of the resistance heating element 12 where the external terminals 13 were to be formed to form a solder layer and further, external terminals 13 made of Kovar were put on the solder layer and heated at 420° C. to carry out reflow and the external terminals 13 were attached to and fixed in the both end parts of the resistance heating element 12.

Incidentally, as shown in FIG. 2, the resistance heating element 12 and the external terminals 13 were connected and after that, the insulating covering 17 might be formed so as to cover the parts of the resistance heating element 12 where the external terminals 13 were formed.

After that, thermocouples (not illustrated) for controlling the temperature of the substrate were inserted into the bottomed holes 14 of the ceramic substrate to obtain a ceramic heater 10 as shown in FIG. 1 and FIG. 2 and the ceramic heater 10 was fitted in a supporting in which a heat insulating ring made of fluoro resin for fitting the ceramic heater was formed in the upper part to obtain a hot plat unit.

Incidentally, since the resistance heating element had a given resistance value, when electric power was applied, heat was generated due to the Joule's heat to heat a semiconductor wafer 19.

Regarding the ceramic heater 10 constituting the hot plate unit, the thermal expansion coefficient of the insulating covering was measured and evaluation was carried out by the following methods.

Evaluation Methods (1) Measurement of Surface Roughness Ra of Insulating Covering Using Therfcom 920A manufactured by Tokyo Seimitsu Co., Ltd., the surface roughness Ra and Rmax were measured.

(2) Measurement of Surface Resistance (Area Resistivity) of Insulating Covering Material Measurement was carried out at a room temperature and D.C. 100 V.

(3) Evaluation of Oxidation Resistance of Resistance Heating Element

Evaluation was carried out by investigating the change of the heater resistance after aging in 200° C.×1000 hours.

(4) Evaluation of Dispersion of Temperature Rising Time

After a silicon wafer was put on the hot plate unit, the time (temperature rising time) taken to heat the silicon wafer to 200° C. was measured 10 times and the ratio of the quickest temperature rising time or the slowest temperature rising time in relation to the average temperature rising time was calculated by % and the higher absolute value calculated by subtraction from 100% was set to be the dispersion of the temperature rise.

(5) Temperature Dropping Time

After the temperature rise was carried out in the conditions of the above-mentioned (4), a coolant at 25° C. (cooling air) was supplied at 0.1 $m^3$/minute and the time (temperature dropping time) taken for cooling to 50° C. was measured and the average value was set to be the temperature dropping time.

(6) Sulfurization Resistance

The ambient atmosphere containing 15% by volume of $H_2S$ was kept at 75° C. and the ceramic heater was left for 10 days in the ambient atmosphere and the resistance alteration ratio of the resistance heating element was measured for the evaluation of the result as the sulfurization resistance.

(7) Occurrence of Migration

The hot plate unit was heated to 200° C. in 100% humidity, electric power was applied for 48 hours and the occurrence of metal diffusion among resistance heating element patterns was measured by a fluorescent x-ray analyzer (EPM-810S manufactured by Shimadzu Corporation).

EXAMPLE 2

A ceramic heater was manufactured in the same manner as Example 1 and subjected to the evaluation similarly to Example 1, except that in place of the oxide type glass material, a heat resistant resin material (polyimide resin) was used and the insulating covering 17 was formed and the roughening treatment was carried out by the following method. The results were shown in Table 1.

That is, at first after a solution of a mixture in a paste-like or viscous liquid-like state containing 80% by weight of an aromatic polyimide powder and 20% by weight of polyamide acid was produced, the solution of the mixture was selectively applied so as to cover the surface of the resistance heating element 12 and form a layer of the mixture on the surface of the resistance heating element 12.

Next, the formed layer of the mixture was heated at 350° C. and dried and solidified in a continuously firing furnace to carry out melt bonding of the mixture to the surface of the resistance heating element 12 and the ceramic substrate 11. After that, the surface of the insulating covering was subjected to sand blast treatment using an alumina powder with an average particle diameter of 1.0 μm to adjust the surface roughness Ra of the insulating covering 17. In this case, the average thickness of the formed insulating covering 17 was 10 μm.

EXAMPLE 3

A ceramic heater was manufactured in the same manner as Example 1 and subjected to the evaluation similarly to Example 1, except that in place of the oxide type glass material, a heat resistant resin material (silicone type resin) was used and the insulating covering 17 was formed and the roughening treatment was carried out by the following method. The results were shown in Table 1.

That is, methylphenyl type silicone resin was selectively applied so as to cover the surface of the resistance heating element 12 by a metal mask printing method and the like and heated at 220° C. and dried and solidified in an oven to carry out melt bonding of the resin to the surface of the resistance heating element 12 and the ceramic substrate 11. At that time, the thickness of the formed insulating covering 17 was 15 μm. The surface roughness Ra of the insulating covering 17 was adjusted by sand blast treatment using an alumina powder with an average particle diameter of 1.5 μm.

EXAMPLE 4

In this example, a ceramic heater was manufactured in the same manner as Example 1 and subjected to the evaluation similarly to Example 1, except that the resistance value of the strip-shaped resistance heating element was increased and the thickness of the insulating covering comprising oxide glass was adjusted to be 20 μm. The results were shown in Table 1.

That was because the resistance value was required to be high in the case of applying voltage of 30 to 300 V to raise the temperature to 200° C. or more. Incidentally, the adjustment of the surface roughness Ra of the insulating covering 17 was conducted by sand blast treatment using an SiC powder with an average particle diameter of 0.1 μm.

As the paste for the resistance heating element, a paste containing silver: 56.6% by weight, palladium: 10.3% by weight, $SiO_2$: 1.1% by weight, $B_2O_3$: 2.5% by weight, ZnO: 5.6% by weight, PbO: 0.6% by weight, $RuO_2$: 2.1% by weight, a resin binder 3.4% by weight, and a solvent: 17.9% by weight was used.

The resistance heating element patterns had a thickness of 10 μm, a width of 2.4 mm, and an area resistivity of 150 mΩ/□.

EXAMPLE 5

A ceramic heater was manufactured in the same manner as Example 4 and subjected to the evaluation similarly to Example 4, except that in place of the oxide type glass material, a heat resistant resin material (polyimide resin) was used and the insulating covering 17 was formed and the roughening treatment was carried out by the method as described in Example 2. The thickness of the insulating covering was adjusted to 10 μm and the surface roughness Ra of the insulating covering 17 was adjusted by sand blast treatment using an alumina powder with an average particle diameter of 0.1 μm. The results were shown in Table 1.

EXAMPLE 6

A ceramic heater was manufactured in the same manner as Example 4 and subjected to the evaluation similarly to Example 4, except that in place of the oxide type glass material, a heat resistant resin material (silicone type resin) was used and the insulating covering 17 was formed and the roughening treatment was carried out by the method as described in Example 3. The thickness of the insulating covering was adjusted to 10 μm and the surface roughness Ra of the insulating covering 17 was adjusted by sand blast treatment using an alumina powder with an average particle diameter of 0.03 μm. The results were shown in Table 1.

COMPARATIVE EXAMPLE 1

A ceramic heater was manufactured in the same manner as Example 1 and subjected to the evaluation similarly to Example 1, except that the ceramic substrate bearing the resistance heating element thereon was immersed in an electroless nickel plating bath to form a metal layer of nickel with a thickness of about 1 μm on the surface of the resistance heating element. The results were shown in Table 1.

The concentrations of the respective components of the above-mentioned nickel plating bath were nickel sulfate 80 g/l, sodium hypophosphite 24 g/l, sodium acetate 12 g/l, boric acid 8 g/l, and ammonium chloride 6 g/l.

COMPARATIVE EXAMPLE 2

A ceramic heater was manufactured in the same manner as Example 1 and subjected to the evaluation similarly to Example 1, except that no surface roughening treatment was carried out after the insulating covering was formed on the surface of the resistance heating element 12. Incidentally, the surface roughness Ra of the ceramic heater was 0.07 μm. The results were shown in Table 1.

COMPARATIVE EXAMPLE 3

A ceramic heater was manufactured in the same manner as Example 4 and subjected to the evaluation similarly to Example 1, except that sand blast treatment using a SiC powder with an average particle diameter of 15 μm was carried out after the insulating covering was formed on the surface of the resistance heating element 12 to form an insulating covering with a surface roughness Ra of 11 μm. The results were shown in Table 1.

COMPARATIVE EXAMPLE 4

A ceramic heater was manufactured in the same manner as Example 1 and subjected to the evaluation similarly to Example 1, except that no insulating covering was formed on the surface of the resistance heating element 12. The results were shown in Table 1.

TABLE 1

| | Insulating covering | | Surface roughness Ra of insulating covering Ra (μm) | Thermal expansion coefficient of insulating covering | Area resistivity of insulating covering | Oxidation resistance (resistivity change in 200° C. × 1000 Hr) | Dispersion of temperature rising time (from 25 to | Temperature dropping time (from 200 to 150° C. | Sulfurization resis- |
|---|---|---|---|---|---|---|---|---|---|
| | Type | Composition | Rmax (μm) | (ppm/° C.) | (Ω/□) | (%) | 200° C.) (%) | (second) | tance (%) |
| Example 1 | Oxide glass | PbO—$SiO_2$—$B_2O_3$ | Ra = 0.861 Rmax = 11.3 | 5 | $10^{16}$ | 0.2 | 0.1 | 110 | 0 |
| Example 2 | Polyimide resin | Aromatic type | Ra = 0.868 Rmax = 6.775 | 12 | $10^{15}$ | 0.3 | 0.2 | 120 | 0 |
| Example 3 | Silicone type resin | Methylphenyl type | Ra = 1.009 Rmax = 6.74 | 13 | $10^{15}$ | 0.3 | 0.1 | 130 | 0 |
| Example 4 | Oxide glass | PbO—$SiO_2$—$B_2O_3$ | Ra = 0.097 Rmax = 1.00 | 5 | $10^{16}$ | 0.1 | 0.1 | 110 | 0 |
| Example 5 | Polyimide resin | Aromatic type | Ra = 0.086 Rmax = 1.02 | 12 | $10^{15}$ | 0.3 | 0.2 | 130 | 0 |
| Example 6 | Silicone type resin | Methylphenyl type | Ra = 0.022 Rmax = 1.23 | 13 | $10^{15}$ | 0.3 | 0.4 | 120 | 0 |
| Comparative Example 1 | Plate | Nickel | — | 13.3 | 50 m | 3 | 0.1 | 90 | 0 |
| Comparative Example 2 | Oxide glass | PbO—$SiO_2$—$B_2O_3$ | Ra = 0.007 | 5 | $10^{16}$ | 0.2 | 0.5 | 160 | 0 |
| Comparative Example 3 | Oxide glass | PbO—$SiO_2$—$B_2O_3$ | Ra = 11 | 5 | $10^{16}$ | 0.2 | 0.5 | 180 | 0 |
| Comparative Example 4 | — | — | — | — | — | 20 | 0.5 | 90 | 200 |

As being made clear from the results shown in Table 1, in Examples 1 to 6, the resistance change of the resistance heating element was as small as 0.1 to 0.3%, whereas in Comparative Example 1, it was high, that is 3%. The reason for that was attributed to resistance alteration owing to the oxidation of the nickel plating film itself and other than that, it was supposed that the nickel plating film was porous, thus diffusion of oxygen and oxidization of the silver occurs in the inside. Further, in Examples 1 to 6, the dispersion of the temperature rising time was small and the temperature dropping speed was relatively quick, whereas in Comparative Examples 2, 3, since the surface roughness Ra of the insulating covering covering the resistance heating element was too low or too high, the temperature dropping speed was retarded.

Further, regarding the occurrence of migration, in the ceramic heater according to Comparative Example 4, Ag migration took place and occurrence of short-circuit among the resistance heating element patterns was highly probable.

FIG. 6 to FIG. 10 respectively show the graphs showing the measurement results of the surface roughness of the insulating coverings constituting the ceramic heaters according to Examples 1 to 5.

Further, in the ceramic heaters according to Examples 1 and 4, the thermal expansion coefficient of the oxide glass, the insulating covering, was 5 ppm/° C. and it was approximately numerically similar to that of aluminum nitride, 3.5 to 4 ppm/° C. and consequently, the resistance change caused by separation of metal particles constituting the resistance heating element owing to expansion and contraction caused in cooling and heating cycles was relatively small as compared with that in the case of using the heat resistant resin.

In Examples 4 to 6, as the resistance heating element, those having an area resistivity of 150 mΩ/□ were used. In this case, since the area resistivity of the insulating covering was $10^{15}$ to $10^{16}$ Ω/□, which is almost complete insulator, even if voltage of 50 to 200 V was applied, the electric current was transmitted in the inside of the resistance heating element and the calorific value was also increased, whereas in the case of forming a nickel plating film as Comparative Example 1, the area resistivity of the nickel plating film was 50 mΩ/□, smaller than that of the resistance heating element, and since electric current is transmitted in parts having a lower resistance value, electric current was transmitted through the nickel plating film to result in low calorific value.

EXAMPLE 7

A ceramic substrate 21 for a ceramic heater was manufactured in the same manner as Example 1 and parts to be through holes 25 to insert lifter pins 16 for a semiconductor wafer into and to be bottomed holes 24 to embed thermocouples therein were bored by drilling process.

Next, in the bottom face of the ceramic substrate 21 for which the above-mentioned processing was finished, the resistance heating element patterns 22*a* to 22*f* with a shape shown in FIG. 3 were formed using the same material as Example 1.

After that, as shown in FIG. 3, at the resistance heating element patterns 22*a*, 22*b*, and 22*c*, the insulating coverings 27*a*, 27*b*, and 27*c* of an oxide glass material were formed to cover the areas sandwiched by resistance heating element constituting circuits and the stretch of the periphery thereof. And on the other hand, at the resistance heating element patterns 22*d*, 22*e*, and 22*f*, the insulating covering 27*d* comprising the same material is formed to cover the areas sandwiched by resistance heating element patterns constituting circuits and their peripheral area and entire area among the respective circuits.

The composition of the above-mentioned oxide glass material was the same as in the case of Example 1, the formation method of the insulating covering 27 was same as that of Example 1 except that the covering areas were extended in a wide area as described above. In this case, the thickness of the insulating covering 27 was 30 μm. However, the portions of both ends of the circuits to be connected with external terminals were not covered with the insulating covering 27. The surface roughness Ra of the insulating covering 27 was adjusted by sand blast treatment using a SiC powder with an average particle diameter of 5 μm.

After that, thermocouples (not illustrated) for temperature control were embedded in the bottomed holes 24 of the ceramic substrate to obtain the ceramic heater 20 shown in FIG. 3 and FIG. 4.

As described above, after the ceramic heater 20 was manufactured using the aluminum nitride substrate 21, evaluation was carried out similarly to Example 1. The results were shown in Table 2.

EXAMPLE 8

A ceramic heater was manufactured in the same manner as Example 7 and subjected to the evaluation similarly to Example 7, except that in place of the oxide type glass material, a heat resistant resin material (polyimide resin) was used and the insulating covering 27 was formed and the roughening treatment was carried out by the following method. The results were shown in Table 2.

That is, at first after a solution of a mixture in a paste-like or viscous liquid-like state containing 80% by weight of an aromatic polyimide powder and 20% by weight of polyamide acid was produced, the solution of the mixture was selectively applied so as to cover the similar areas to those of Example 7 and heated at 350° C. and dried and solidified in a continuously firing furnace to form the insulating coverings 27*a* to 27*d*. The thickness of the insulating covering 27 was 30 μm and the surface roughness Ra of the insulating covering 27 was adjusted by sand blast treatment using an alumina powder with an average particle diameter of 4.2 μm.

EXAMPLE 9

A ceramic heater was manufactured in the same manner as Example 7 and subjected to the evaluation similarly to Example 7, except that in place of the oxide type glass material, a heat resistant resin material (silicone type resin) was used and the insulating covering 27 was formed and the roughening treatment was carried out by the following method. The results were shown in Table 2.

That is, methylphenyl type silicone resin was selectively applied so as to cover the surface of the resistance heating element 12 by a metal mask printing method and the like and heated at 220° C. and dried and solidified to form the insulating coverings 27*a* to 27*d*. The thickness of the insulating covering 27 was 30 μm. The surface roughness Ra of the insulating covering 27 was adjusted by sand blast treatment using an alumina powder with an average particle diameter of 2.0 μm.

TABLE 2

| | Insulating covering | | Surface roughness Ra of insulating covering Ra (μm) | Thermal expansion coefficient of insulating covering | Sheet resistivity of insulating covering | Oxidation resistance (resistivity change in 200° C. × 1000 Hr) | Dispersion of temperature rising time (from 25 to | Temperature dropping time (from 200 to 150° C. | Sulfurization resis- |
|---|---|---|---|---|---|---|---|---|---|
| | Type | Composition | Rmax (μm) | (ppm/° C.) | (Ω/□) | (%) | 200° C.) (%) | (second) | tance (%) |
| Example 7 | Oxide glass | $PbO—SiO_2—B_2O_3$ | Ra = 4.030 Rmax = 20.52 | 5 | $10^{16}$ | 0.2 | 0.1 | 110 | 0 |
| Example 8 | Polyimide resin | Aromatic type | Ra = 3.250 Rmax = 20.92 | 12 | $10^{15}$ | 0.3 | 0.1 | 120 | 0 |

TABLE 2-continued

| | Insulating covering | | Surface roughness Ra of insulating covering Ra (μm) Rmax (μm) | Thermal expansion coefficient of insulating covering (ppm/° C.) | Sheet resistivity of insulating covering (Ω/□) | Oxidation resistance (resistivity change in 200° C. × 1000 Hr) (%) | Dispersion of temperature rising time (from 25 to 200° C.) (%) | Temperature dropping time (from 200 to 150° C. (second) | Sulfurization resistance (%) |
|---|---|---|---|---|---|---|---|---|---|
| | Type | Composition | | | | | | | |
| Example 9 | Silicone type resin | Methylphenyl type | Ra = 2.040 Rmax = 15.30 | 13 | $10^{15}$ | 0.3 | 0.1 | 130 | 0 |

As being made clear from the results shown in Table 2, also in Examples 7 to 9, the area resistivity of the insulating coverings was as high as $10^{15}$ to $10^{16}$ Ω/□ and the resistance change of the resistance heating element covered with such insulating coverings was as small as 0.2 to 0.3%. Further, the dispersion of the temperature rising time was small and the temperature dropping speed was relatively quick.

Further, after the oxidation resistant test was carried out in Examples 8, 9, the insulating covering 27 was forcibly peeled off from the surface of the ceramic substrate and observation for checking whether migration of a metal such as silver on the surface of the resistance heating element took place or not, was carried out in the same manner as Example 1. As a result, no migration was found taking place.

EXAMPLE 10

A composition containing 100 parts by weight of a SiC powder (average particle diameter: 1.1 μm), 4 parts by weight of $B_4C$, 12 parts by weight of an acrylic binder, and alcohol was spray dried to produce a granular powder.

Next, the granular powder was put in a die and molded into a flat shape to obtain a raw formed body and the raw formed body was hot pressed at a temperature of 1890° C. and a pressure of 20 MPa to obtain a plate-like sintered body of SiC with a thickness of about 3 mm. Next, the surface of the plate-like sintered body was ground by diamond wheel of #800 and grinded with a diamond paste to adjust to: Ra=0.008 μm. Further, a glass paste (G-5177 made by Shouei Chemical Products Inc.) was applied and heated to 600° C. to form a $SiO_2$ layer with a thickness of 3 μm.

Then, the plate-like sintered body was cut to obtain a disk-like body with a diameter of 210 mm as a ceramic substrate. After that, the face where the above-mentioned $SiO_2$ layer was formed was used for the face where the resistance heating element was to be formed and as shown in FIG. 5, a ceramic heater was produced in the same manner as Example 1, except that the insulating covering (oxide glass) with a thickness of 50 μm was formed in the entire areas where the resistance heating element was formed and roughened surface was formed by sand blast treatment using a SiC powder with an average particle diameter of 10 μm.

As described above, after the ceramic heater was produced using the substrate of SiC, evaluation was carried out similarly to Example 1. The results were shown in Table 3.

EXAMPLE 11

A ceramic heater was manufactured in the same manner as Example 10 and subjected to the evaluation similarly to Example 10, except that in place of the oxide type glass material, a heat resistant resin material (polyimide resin) was used and the insulating covering 37 was formed and the roughening treatment was carried out by sand blast using an alumina powder with an average particle diameter of 10 μm. The results were shown in Table 3.

That is, at first after a solution of a mixture in a paste-like or viscous liquid-like state containing 80% by weight of an aromatic polyimide powder and 20% by weight of polyamide acid was produced, the solution of the mixture was applied so as to cover the entire areas where the resistance heating element 12 was formed and form a layer of the mixture.

After that, the formed layer of the mixture was heated at 350° C. and dried and solidified in a continuously firing furnace to melt the mixture and let it adhered to the surface of the resistance heating element and the ceramic substrate, and then roughening treatment was carried out in the above-mentioned conditions. In this case, the thickness of the formed insulating covering was 50 μm.

EXAMPLE 12

A ceramic heater was manufactured in the same manner as Example 10 and subjected to the evaluation similarly to Example 10, except that roughening treatment using a SiC powder with an average particle diameter of 8 μm was carried out for the insulating covering (oxide glass). The results were shown in Table 3.

EXAMPLE 13

A ceramic heater was manufactured in the same manner as Example 10 and subjected to the evaluation similarly to Example 10, except that in place of the oxide type glass material, a heat resistant resin material (polyimide resin) was used and the insulating covering 37 was formed similarly to Example 11 and roughening treatment using an alumina powder with an average particle diameter of 8 μm was carried out. The results were shown in Table 3.

TABLE 3

| Insulating covering | | | Surface roughness Ra of insulating covering Ra ($\mu$m) | Thermal expansion coefficient of insulating covering | Area resistivity of insulating covering | Oxidation resistance (resistivity change in 200° C. × 1000 Hr) | Dispersion of temperature rising time (from 25 to | Temperature dropping time (from 200 to 150° C. | Sulfurization resis- |
|---|---|---|---|---|---|---|---|---|---|
| | Type | Composition | Rmax ($\mu$m) | (ppm/° C.) | (Ω/□) | (%) | 200° C.) (%) | (second) | tance (%) |
| Example 10 | Oxide glass | PbO—$SiO_2$—$B_2O_3$ | Ra = 8.230 Rmax = 100.01 | 5 | $10^{16}$ | 0.2 | 0.4 | 110 | 0 |
| Example 11 | Polyimide resin | Aromatic type | Ra = 9.352 Rmax = 150.32 | 12 | $10^{15}$ | 0.3 | 0.5 | 120 | 0 |
| Example 13 | Oxide glass | PbO—$SiO_2$—$B_2O_3$ | Ra = 7.252 Rmax = 98.32 | 5 | $10^{16}$ | 0.2 | 0.4 | 130 | 0 |
| Example 12 | Polyimide resin | Aromatic type | Ra = 6.252 Rmax = 82.32 | 12 | $10^{15}$ | 0.3 | 0.4 | 120 | 0 |

As being made clear from the results shown in Table 3, in Examples 10 to 13, the resistance change of the resistance heating element was as small as 0.2 to 0.3%. Further, the dispersion of the temperature rising time was slightly high as compared with those of Examples 1 to 7, attributed to high surface roughness of the insulating covering, however the temperature dropping speed was not so much changed and relatively quick.

As described above, the ceramic heater of the first aspect of the present invention had a small resistance change ratio, slight dispersion of temperature rising time, a high temperature dropping time, and was excellent in temperature controllability. Further, it was excellent in the corrosion resistance to reactive gas such as $O_2$ and $H_2S$ in a semiconductor producing device.

Further, since the insulating covering was of an insulator, even if the resistance value of the resistance heating element was increased, no electric current flowed in the insulating covering and a heater having a usable range of 150° C. or more was able to be obtained.

Also, in the case the oxide glass was used for the insulating covering, since it had excellent adhesion property to the ceramic substrate and had a small thermal expansion coefficient, cracks were hardly formed and at the same time, the resistance change ratio of the resistance heating element was small.

Further, in the case the heat resistant resin was used for the insulating covering, the insulating covering could be formed at a relatively low temperature.

As described above, the ceramic heater of the first aspect of the present invention was the most optimum to be used as a heater for a middle temperature range from 200 to 400° C. and a high temperature range from 400 to 800° C.

EXAMPLE 14

Adjustment of Resistance Value of Resistance Heating Element by Laser Trimming (1) A composition containing 100 parts by weight of an aluminum nitride powder (average particle diameter: 0.6 $\mu$m), 4 parts by weight of yttria (average particle diameter: 0.4 $\mu$m), 12 parts by weight of an acrylic resin binder, and alcohol was spray dried to produce a granular powder.

(2) Next, the granular powder was put in a die and molded into a flat shape to obtain a raw formed body (a green).

(3) The raw formed body was hot pressed at a temperature of 1800° C. and a pressure of 20 MPa to obtain a plate-like aluminum nitride body with a thickness of 3 mm.

Next, the plate-like body was cut to obtain a disk-like body with a diameter of 210 mm and made to be a plate-like body comprising a ceramic (a ceramic substrate 111). The ceramic substrate was subjected to drilling-process to form through holes 135 to insert lifter pins for a silicon wafer into and bottomed holes 134 (the diameter: 1.1 mm; the depth: 2 mm) to embed thermocouples in.

(4) A conductor containing paste layer was formed on the ceramic substrate 111 obtained in the above-mentioned (3) by screen printing. The printed patterns were the patterns as shown in FIG. 3.

As the conductor containing paste, a paste having a composition containing Ag: 48% by weight, Pt: 21% by weight, $SiO_2$: 1.0% by weight, $B_2O_3$: 1.2% by weight, ZnO: 4.1% by weight, PbO: 3.4% by weight, ethyl acetate: 3.4% by weight, and butyl carbitol: 17.9% by weight was employed.

The conductor containing paste was Ag—Pt paste and silver particle (Ag-540 made by Shouei Chemical Products Inc.) had an average particle diameter of 4.5 $\mu$m and a scaly shape. The Pt particle (Pd-221 made by Shouei Chemical Products Inc.) had an average particle diameter of 6.8 $\mu$m and a spherical shape.

The viscosity of the conductor containing paste was 80 Pa·s.

(5) Further, after formation of the conductor containing paste layer of the heating element patterns, the ceramic substrate 111 was heated and fired at 850° C. for 10 to 20 minutes to sinter Ag and Pt in the conductor containing paste and at the same time bake them on the ceramic substrate.

The resistance heating element patterns had as shown in FIG. 13, seven channels 112*a* to 112*g*. The dispersion of the resistance values of the four channels (the resistance heating element patterns 112*a* to 112*d*) in the periphery before performing trimming was 7.4 to 12.4%.

Incidentally, the term, channel, means a circuit to be controlled solely by applying same voltage and in this example, denotes the respective resistance heating element patterns (112*a* to 112*g*) formed as continuous bodies.

The resistance dispersion in the respective channels (the resistance heating element patterns 112*a* to 112*d*) was calculated as follows. That is, at first, each channel was divided into twenty divisions and resistance thereof was measured between both ends in the divisions. Then, the average value thereof was defined as the average division resistance and then, the dispersion was calculated from the difference between the highest resistance value and the lowest resistance value and the average division resistance value. Further, the resistance value in the respective channels (the resistance heating element patterns 112*a* to 112*d*) is the total of the resistance values measured separately.

(6) Next, using YAG laser (S143AL, manufactured by NEC, output 5 W, pulse frequency set range 0.1 to 40 kHz) having wavelength of 1060 nm as an equipment for trimming, the pulse frequency was set to be 1.0 kHz. The equipment was equipped with an X-Y stage, a galvanomirror, a CCD camera, Nd: YAG laser and a controller built therein to control the stage and the galvanomirror, and the controller was connected to a computer (FC-9821, manufactured by NEC). The computer was provided with a CPU working as a computing unit and a memory unit and also provided with a hard disk and a 3.5-inch FD drive working as a memory unit and an input unit.

The resistance heating element pattern data was inputted from the FD drive to the computer and the position of the resistance heating element was read out (reading was carried out on the bases of markers formed in specified points of the conductor layer or in the ceramic substrate). Then, necessary control data was computed and the resistance heating element patterns were irradiated in the direction approximately parallel along the direction of electric current flow to remove the conductor layer in the irradiated portions and form gutters with a width of 50 μm reaching the ceramic substrate, so that the resistance value was adjusted. The resistance heating element had a thickness of 5 μm and a width of 2.4 mm. The laser was irradiated with a frequency of 1 kHz, an output of 0.4 W, a bit size of 10 μm, and a processing speed of 10 mm/second.

In such a manner, trimming was performed and the dispersion of the resistance values of four channels (resistance heating element patterns 112*a* to 112*d*) in the periphery after the adjustment of the resistance value of the resistance heating element was remarkably decreased to 1.0 to 5.0%.

(7) Next, Ni plating was carried out for the portions to which the external terminals 133 were to be attached in order to assure the connection to an electric power, a silver-lead solder paste (made by Tanaka Kikinzoku Kogyo K. K.) was printed to form solder layers by screen printing.

Then, external terminals 133 made of Kovar were put on the solder layers and heated at 420° C. to carry out reflow and the external terminals 133 were attached to the surface of the resistance heating element patterns.

(8) Thermocouples for controlling the temperature were sealed with polyimide to obtain a ceramic heater 110.

EXAMPLE 15

Production of Ceramic Heater (Resistance Heating Element Formation by Laser Trimming)

In this example, a ceramic heater having the resistance heating element patterns shown in FIG. 13 was manufactured.

(1) A composition containing 100 parts by weight of an aluminum nitride powder (average particle diameter: 1.1 μm), 4 parts by weight of yttria (average particle diameter: 0.4 μm) 12 parts by weight of an acrylic resin binder, and alcohol was spray dried to produce a granular powder.

(2) Next, the granular powder was put in a die and molded into a flat shape to obtain a raw formed body (a green).

(3) The raw formed body was hot pressed at a temperature of 1800° C. and a pressure of 20 MPa to obtain a plate-like aluminum nitride body with a thickness of some 3 mm.

Next, the plate-like body was cut to obtain a disk with a diameter of 210 mm and made to be a plate-like body made of a ceramic (a ceramic substrate 111). The ceramic substrate was subjected to drilling-process to form through holes 135 to insert lifter pins 136 for a silicon wafer into and bottomed holes (not illustrated) (the diameter: 1.1 mm; the depth: 2 mm) to embed thermocouples in (reference to FIG. 16(*a*)).

(4) A conductor containing paste layer 112*m* was formed on the ceramic substrate 111 obtained in the above-mentioned (3) by screen printing. The printed patterns were the concentric circles-like (ring-shaped) patterns having a given width and formed in a plane-shape so as to include the resistance heating element patterns 112*a* to 112*g* which are going to be the respective circuits of the resistance heating element shown 112 in FIG. 13 (reference to FIG. 16(*b*)).

As the conductor containing paste, a silver paste containing 7.5 parts by weight of metal oxides consisting of lead oxide: 5% by weight, zinc oxide: 55% by weight, silica: 10% by weight, boron oxide: 25% by weight, and alumina: 5% by weight in 100 parts by weight of silver was employed. The silver particle (Ag-540, made by Shouei Chemical Products Inc.) had an average particle diameter of 4.5 μm and a scaly shape.

The viscosity of the conductor containing paste was 80 Pa·s.

(5) Further, after formation of the conductor containing paste layer of the heating element patterns, the ceramic substrate 111 was heated and fired at 780° C. for 20 minutes to sinter silver in the conductor containing paste and at the same time bake them on the ceramic substrate.

(6) Next, using YAG laser (S143AL, manufactured by NEC, output 5 W, pulse frequency set range 0.1 to 40 kHz) having wavelength of 1060 nm was used as an equipment for trimming, the pulse frequency was set to be 1.0 kHz to perform trimming.

The equipment was equipped with an X-Y stage, a galvanomirror, a CCD camera, Nd: YAG laser and a controller built therein to control the stage and the galvanomirror and the controller was connected to a computer (FC-9821, manufactured by NEC). The computer was provided with a CPU working as a computing unit and a memory unit and also provided with a hard disk and a 3.5-inch FD drive working as a memory unit and an input unit.

The X-Y stage was made to be rotatable at optional angle θ around fixed center axis A of the ceramic substrate.

The resistance heating element pattern data was inputted from the FD drive to the computer and the position of the resistance heating element was read out (reading was carried out on the basis of markers formed in specified points of the conductor layer or in the ceramic substrate) and necessary control data was computed and while the ceramic substrate 111 being rotated, laser beam was irradiated to the portions of the conductor containing paste layer other than the areas where resistance heating element patterns were to be formed to remove the conductor containing paste layer in the irradiated portions and form the resistance heating element 112 with patterns shown in FIG. 13 (reference to FIG. 16(*c*)). The resistance heating element had a thickness of 5 μm, a width of 2.4 mm, and an area resistivity of 7.7 mΩ/□.

(7) Next, the ceramic substrate 111 produced in the above-mentioned (6) was immersed in an electroless nickel plating bath of an aqueous solution containing nickel sulfate 80 g/l, sodium hypophosphite 24 g/l, sodium acetate 12 g/l, boric acid 8 g/l, and ammonium chloride 6 g/l to form a metal covering layer (a nickel layer) 1120 with a thickness of about 1 μm on the surface of the silver-lead resistance heating element 112.

(8) Solder layers were formed on the portions to which the external terminals 133 were to be attached in order to assure the connection to an electric power by printing a silver-lead solder paste (made by Tanaka Kikinzoku Kogyo K.K.) by screen printing.

Then, external terminals 133 made of Kovar were put on the solder layers and heated at 420° C. to carry out reflow and the external terminals 133 were attached to the surface of the resistance heating element 112 (FIG. 16(*d*)).

(9) Thermocouples for controlling the temperature were sealed with polyimide to obtain a ceramic heater 110.

EXAMPLE 16

Adjustment of Resistance Value of Resistance Heating Element by Laser Trimming A ceramic heater was manufactured in the same manner as Example 14 except that in the step (5) of Example 14, surface roughening was carried out by sand blast treatment using $Al_2O_3$ (the average particle diameter: 10 μm) after baking the Ag—Pt paste applied to the ceramic substrate.

EXAMPLE 17

Adjustment of Resistance Value of Resistance Heating Element by Laser Trimming A ceramic heater was manufactured in the same manner as Example 14 except that in the step (5) of Example 14, surface roughening was carried out by sand blast treatment using $Al_2O_3$ (the average particle diameter: 20 μm) after baking the Ag—Pt paste applied to the ceramic substrate.

EXAMPLE 18

A ceramic heater made of silicon carbide was manufactured in the same manner as Example 14 except that silicon carbide with an average particle diameter of 1.0 μm was used in stead of aluminum nitride and the sintering temperature was set at 1900° C. and further, after a glass paste containing 50 parts by weight of a glass powder (borosilicate glass) with an average particle diameter of 0.5 μm, 20 parts by weight of ethyl alcohol, and 5 parts by weight of polyethylene glycol was applied to the surface of the obtained heater plate, an $SiO_2$ layer with a thickness of 10 μm was formed on the surface by firing it at 1500° C. for 2 hours and alumina (the average particle diameter: 0.01 μm) was used for sand-blasting.

EXAMPLE 19

A ceramic heater made of silicon carbide was manufactured in the same manner as Example 14 except that silicon carbide with an average particle diameter of 1.0 μm was used and the sintering temperature was set at 1900° C. and further after a glass paste (borosilicate glass) containing 50 parts by weight of a glass powder with an average particle diameter of 0.5 μm, 20 parts by weight of ethyl alcohol, and 5 parts by weight of polyethylene glycol was applied to the surface of the obtained heater plate, an $SiO_2$ layer with a thickness of 10 μm was formed on the surface by firing it at 1500° C. for 2 hours and alumina (the average particle diameter: 0.01 μm) was used for the sand blasting.

COMPARATIVE EXAMPLE 5

Adjustment of Resistance Value of Resistance Heating Element by Laser Trimming A ceramic heater was manufactured in the same manner as Example 14, except that the resistance heating element was formed by using a conductor containing paste having the following composition and heating and firing the paste.

The conductor containing paste was a Ag—Pt paste with a composition same as that in Example 14 and the silver particle (Ag-128, made by Shouei Chemical Products Co., Ltd.) had an average particle diameter of 0.6 μm and a spherical shape. The Pt particle (Pd-215, made by Shouei Chemical Products Co., Ltd.) had an average particle diameter of 0.6 μm and a spherical shape.

The viscosity of the conductor containing paste was 80 Pa·s.

Further, after the conductor containing paste layer in the heating element patterns was formed, the ceramic substrate 111 was heated and fired at 850° C. for 20 minutes to sinter Ag and Pt in the conductor containing paste and bake them on the ceramic substrate 111.

COMPARATIVE EXAMPLE 6

Manufacture of Ceramic Heater (Resistance Heating Element Formation by Laser Trimming)

A ceramic heater was manufactured in the same manner as Example 15 except that the resistance heating element was formed by using a conductor containing paste having the following composition and heating and firing the paste.

The conductor containing paste was a silver paste with a composition same as that in Example 15. The silver particle (Ag-128, made by Shouei Chemical Products Co., Ltd.) had an average particle diameter of 0.6 μm and a spherical shape.

The viscosity of the conductor containing paste was 80 Pa·s.

Further, after the conductor containing paste layer in the resistance heating element patterns was formed, the ceramic substrate 111 was heated and fired at 780° C. for 20 minutes to sinter silver and lead in the conductor containing paste and bake them on the ceramic substrate 111.

Evaluation Method (1) Measurement of Surface Roughness Ra of Conductor Layer (Resistance Heating Element)

Figure 17:
FIG. 17 is a chart showing the surface roughness of the resistance heating element surface formed on the ceramic heater according to Example 14.
Figure 18:
FIG. 18 is a chart showing the surface roughness of the conductor layer surface formed on the ceramic substrate according to Example 15.

The surface roughness Ra of the surface of the resistance heating element (the conductor layer) on the ceramic substrate formed in each of the above-mentioned Examples and Comparative Examples was measured according to JIS B 0601 using a surface roughness measurement apparatus (Therfcom 920A manufactured by Tokyo Seimitsu Co., Ltd.). The surface roughness Ra obtained from the measurement results was shown in Table 1. The charts showing the measurement results of Example 14 and Example 15 were respectively shown in FIG. 17 and FIG. 18.

(2) Measurement of Gutter Shape

In Examples 14, 16, 17 and Comparative Example 5, after the resistance heating element was formed on the ceramic substrate and gutters were formed on the resistance heating element, the width and the depth of the gutters were measured. Further, in Example 15 and Comparative Example 6, after the conductor layer was formed on the ceramic substrate, gutters were formed in the portions of the conductor layer to be removed and the width and the depth of the gutters were measured. The width and the depth of the gutters were measured by a laser displacement meter manufactured by Kience Co. The results were shown in Table 4.

(3) Temperature Measurement of Heating Face

After the ceramic heater according to each of the above-mentioned Examples and Comparative Examples was heated to 300° C., the temperature of the heating face of the ceramic substrate was measured by a thermoviewer (IR- 162012-0012, manufactured by Nippon Datam Co.) and the temperature difference between the lowest temperature and the highest temperature was calculated. The results were shown in Table 4. The temperature difference in Table 4 means the temperature difference between the lowest temperature and the highest temperature.

(4) Occurrence of Crack Formation

Regarding each ceramic heater of Examples 14 to 19 and Comparative Examples 5, 6, a glass layer with a thickness of 10 μm was formed by applying a glass paste (borosilicate glass) comprising 50 parts by weight of a glass powder with an average particle diameter of 0.5 μm, 20 parts by weight of ethyl alcohol, and 5 parts by weight of polyethylene glycol to the surface and firing the paste at 1500° C.

The resulting ceramic heater was heated to 200° C. in an oven and immersed in water at 25° C. in order to observe the occurrence of the cracks in the glass layer.

For the ceramic heaters of Examples 14 to 18, no crack was observed. However, for the ceramic heaters of Example 19 and Comparative Examples 5 and 6, cracks were found formed.

TABLE 4

| | Surface roughness Ra of conductor layer (resistance heating element) (μm) | Shape of gutters (μm) Width (dispersion) | Depth (dispersion) | Temperature difference of heating face (° C.) |
|---|---|---|---|---|
| Example 14 | 0.8 | 50 (0.5) | 5 (0.05) | 0.5 |
| Example 15 | 0.3 | 50 (0.5) | 5 (0.05) | 0.5 |
| Example 16 | 9.8 | 50 (0.1) | 5 (0.01) | 0.5 |
| Example 17 | 15 | 50 (0.1) | 5 (0.02) | 0.6 |
| Example 18 | 0.01 | 50 (0.5) | 5 (0.05) | 0.6 |
| Example 19 | 18 | 50 (1.0) | 5 (0.1) | 1.5 |
| Comparative Example 5 | 0.007 | 50 (5.0) | 5 (2.0) | 5.0 |
| Comparative Example 6 | 0.005 | 50 (4.8) | 5 (1.9) | 4.8 |

As being made clear from the results shown in Table 4, in ceramic heaters according to Examples 14 to 19, gutters were formed in the resistance heating elements by irradiating laser beam to the resistance heating elements having a surface roughness Ra of 0.01 μm or more and performing trimming, and the formed gutters had a width of 50 μm and a depth of 5.0 μm as designed. Accordingly, the resistance values of the resistance heating elements could precisely be adjusted and the temperature difference between the highest temperature and the lowest temperature in the heating faces of the ceramic substrate was small.

In Example 15, the resistance heating element was formed by performing trimming and since the trimming was carried out by irradiating laser beam to the conductor layer with a surface roughness Ra of 0.01 μm or more, precise patterns were formed and the temperature difference between the highest temperature and the lowest temperature in the heating face was small.

On the other hand, in the case of the ceramic heater according to Comparative Example 5, the surface roughness Ra of the resistance heating element was less than 0.01 μm and the surface was so flat that the laser beam was reflected, and gutters could not be formed by performing trimming, and the resistance value of the resistance heating element could not be controlled, and the temperature difference between the highest temperature and the lowest temperature in the heating face of the ceramic substrate was too large for practical use.

Also, in the case of the ceramic heater according to Comparative Example 6, since the surface roughness Ra of the resistance heating element was less than 0.01 μm, the surface was so flat that the laser beam was reflected, and gutters could not be formed by performing trimming, and the resistance heating element with designed patterns could not be formed, and portions of conductor layer which should be removed were left and consequently, the temperature difference between the highest temperature and the lowest temperature in the heating face of the ceramic substrate became too large.

Among the ceramic heaters according to Examples, the ceramic heater according to Example 19 had the largest temperature difference between the highest temperature and the lowest temperature in the heating face. It was supposed to be attributed to the fact that the surface roughness was so high to make the dispersion of the resistance value of the resistance heating element wide, resulting in the large temperature difference.

As described above, in the ceramic heaters obtained in Examples, laser beam was irradiated to the resistance heating element or the conductor layer with a surface roughness Ra of 0.01 μm or more to perform trimming, so that incomplete trimming of the resistance heating element or the conductor layer owing to reflection of the laser beam never took place and precise patterns were easily formed and grooves with a precise width was able to be formed.

INDUSTRIAL APPLICABILITY

As described above, the ceramic heater according to the first aspect of the present invention comprises a resistance heating element with a small resistance change ratio, has a sufficient temperature rising and temperature dropping speed and is excellent in temperature controllability. Also, corrosion resistance to the reactive gases in a semiconductor producing device is also excellent and the insulating covering is of an insulator, so that the resistance value of the resistance heating element can be made high and the heater can be used as a heater for a middle temperature or a high temperature use.

Further, in the case the insulating covering is formed in the stretch of given area including the resistance heating element-formed area, the above-mentioned effects are provided and also migration of metal such as silver can be prevented. Further, since the covering is easy, the formation cost of the insulating covering can be reduced.

According to the ceramic heater manufacturing method of the second aspect of the present invention, since the resistance value of the resistance heating element is adjusted by irradiating laser beam to the resistance heating element having a surface roughness Ra of 0.01 μm or more according to JIS B 0601 and performing trimming, reflection of laser beam can be prevented and the resistance heating element can be trimmed as designed and consequently, the resistance value of the resistance heating element can precisely be adjusted.

Also, according to the ceramic heater manufacturing method of the third aspect of the present invention, since the resistance heating element in given patterns is formed by irradiating laser beam to the conductor layer having a surface roughness Ra of 0.01 μm or more based on JIS B 0601 and performing trimming, reflection of laser beam can be prevented and the unnecessary portions of the conductor layer can be trimmed as designed and consequently, a ceramic heater having precise patterns and excellent in the temperature evenness of the heating face can be obtained.

Further, according to the ceramic heater of the fourth aspect of the present invention, since the surface roughness of the resistance heating element surface is high, the atmosphere gas can be stagnated and air can be prevented from flowing in the gutters and the cuts in the resistance heating element to suppress formation of low temperature portions owing to the existence of the cuts and gutters. Consequently, the temperature evenness of the heating face can be improved further.

What is claimed is:

1. A ceramic heater comprising:

a ceramic substrate;

a resistance heating element, which is composed of one circuit or more circuits, disposed on a surface of a ceramic substrate; and an insulating covering provided on said resistance heating element, wherein said insulating covering has a surface roughness Ra of 0.01 to 10 μm in accordance with JIS B 0601.

2. The ceramic heater according to claim 1, wherein said insulating covering is formed in a stretch of area containing a portion on which said circuits are formed.

3. The ceramic heater according to claim 1, wherein said ceramic substrate comprises a nitride ceramic or a carbide ceramic.

4. The ceramic heater according to claim 1, wherein said insulating covering comprises an oxide glass.

5. The ceramic heater according to claim 1, wherein said insulating covering comprises a heat resistant resin material.

6. The ceramic heater according to claim 5, wherein said heat resistant resin material is one kind or more selected from a polymide type resin and a silicone type resin.

7. The ceramic heater according to claim 1, wherein a heating face is a side opposed to the side on which said resistance heating element is formed.

8. The ceramic heater according to claim 1, wherein said insulating covering covers the resistance heating element comprising two or more circuits in a lump.

9. A ceramic heater comprising:

a ceramic substrate; and a resistance heating element formed on a surface of said ceramic substrate, wherein an elongated gutter or cut is formed at a part of said resistance heating element, and said resistance heating element has a surface roughness Ra of 0.01 μm or more.

10. The ceramic heater according to claim 9, wherein said resistance heating element is covered with an insulating layer.

11. The ceramic heater according to claim 9, wherein said surface roughness is in accordance with JIS B 0601.

12. The ceramic heater according to claim 9, wherein said elongated gutter or cut is an elongated gutter that extends substantially parallel to an electric flow direction of said resistance heating element.

13. The ceramic heater according to claim 9, wherein said elongated gutter or cut is an elongated cut that extends substantially perpendicular to an electric flow direction of said resistance heating element.

14. The ceramic heater according to claim 1, wherein said surface roughness of said insulating covering is provided on an outermost surface of said ceramic heater.

15. A ceramic heater comprising:

a ceramic substrate;

a resistance heating element disposed on a surface of said ceramic substrate; and an insulating covering provided on said resistance heating element, wherein said insulating covering has an exterior surface with a surface roughness of 0.01 to 10μm.

16. The ceramic heater according to claim 15, wherein said ceramic substrate comprises a nitride ceramic or a carbide ceramic.

17. The ceramic heater according to claim 15, wherein said insulating covering comprises an oxide glass or a heat resistant resin material.

18. The ceramic heater according to claim 15, wherein said heat resistant resin material is one kind or more selected from a polymide type resin and a silicone type resin.

19. The ceramic heater according to claim 15, wherein a heating face is a side opposed to the side on which said resistance heating element is formed.

20. The ceramic heater according to claim 15, wherein said insulating covering covers the resistance heating element comprising two or more circuits in a lump.

21. The ceramic heater according to claim 15, wherein said surface roughness of said insulating covering is provided on an outermost surface of said ceramic heater.

* * * * *